United States Patent
Yazami

(10) Patent No.: US 11,901,517 B2
(45) Date of Patent: Feb. 13, 2024

(54) METHOD AND SYSTEM FOR ASSESSING A STATE OF CHARGE/DISCHARGE (SOC/SOD) FOR AN ELECTROCHEMICAL CELL

(71) Applicant: Yazami IP PTE. LTD., Singapore (SG)

(72) Inventor: Rachid Yazami, Singapore (SG)

(73) Assignee: Yasmi IP PTE. LTD., Singapore (SG)

( * ) Notice: Subject to any disclaimer, the term of this patent is extended or adjusted under 35 U.S.C. 154(b) by 294 days.

(21) Appl. No.: 16/770,560

(22) PCT Filed: Dec. 7, 2018

(86) PCT No.: PCT/IB2018/059751
§ 371 (c)(1),
(2) Date: Jun. 5, 2020

(87) PCT Pub. No.: WO2019/111220
PCT Pub. Date: Jun. 13, 2019

(65) Prior Publication Data
US 2021/0057926 A1 Feb. 25, 2021

(30) Foreign Application Priority Data
Dec. 7, 2017 (SG) .............................. 10201710152T

(51) Int. Cl.
*H02J 7/00* (2006.01)
*H01M 10/42* (2006.01)
(Continued)

(52) U.S. Cl.
CPC ...... *H01M 10/425* (2013.01); *G01R 31/3842* (2019.01); *G01R 31/392* (2019.01);
(Continued)

(58) Field of Classification Search
CPC .... H01M 10/446; H02J 7/007; H02J 7/00714; H02J 7/00712; H02J 7/00716;
(Continued)

(56) References Cited

U.S. PATENT DOCUMENTS 9,461,496 B1    10/2016  Zhang et al.
2012/0310565 A1*  12/2012  Redey ................. G01R 31/367
                                                          702/63
(Continued)

OTHER PUBLICATIONS

Manane et al.; Accurate state of charge assessment of lithium manganese batteries, vol. 359, Aug. 15, 2017, pp. 422-426.*
(Continued)

*Primary Examiner* — Yalkew Fantu
(74) *Attorney, Agent, or Firm* — TraskBritt

(57) ABSTRACT

A method for assessing a state of charge/discharge (SOC/SOD) for a secondary electrochemical cell, the cell having a first operational mode during which the cell is charged from a power supply connected to terminals of the cell, a second operational mode during which the cell is discharged into a load and a rest mode, the method comprising steps of measuring entropy and enthalpy for the electrochemical cell in the course of the first and second operational modes and during rest, and calculating a data representative of the state of charge/discharge (SOC/SOD).

15 Claims, 39 Drawing Sheets

(51) Int. Cl.
*G01R 31/392* (2019.01)
*G01R 31/3842* (2019.01)
*H01M 10/48* (2006.01)
*H01M 50/569* (2021.01)

(52) U.S. Cl.
CPC ......... *H01M 10/48* (2013.01); *H01M 10/486* (2013.01); *H01M 50/569* (2021.01); *H02J 7/005* (2020.01); *H02J 7/0048* (2020.01)

(58) Field of Classification Search
CPC ................. H02J 7/008; H02J 7/007188; H02J 7/007184; H02J 7/007182; H02J 7/00718; H02J 7/0048; H02J 7/005; H02J 7/0003; H02J 7/00032; H02J 7/00034; H02J 7/00036; H02J 7/00045; H02J 7/00047; H02J 7/342; G01R 31/392; G01R 31/3842
USPC .................................................. 320/112, 137
See application file for complete search history.

(56) References Cited

U.S. PATENT DOCUMENTS

| | | | |
|---|---|---|---|
| 2016/0089994 A1* | 3/2016 | Keller | B60L 53/14 |
| | | | 320/153 |
| 2016/0146895 A1* | 5/2016 | Yazami | H01M 10/486 |
| | | | 324/426 |
| 2016/0190833 A1* | 6/2016 | Roumi | H02J 7/00 |
| | | | 320/136 |
| 2016/0226262 A1* | 8/2016 | Fukubayashi | H02J 7/007 |
| 2017/0229891 A1* | 8/2017 | Lee | H02J 7/04 |

OTHER PUBLICATIONS

International Search Report for International Application No. PCT/IB2018/059751 dated Mar. 11, 2019, 4 pages.
International Written Opinion for International Application No. PCT/IB2018/059751 dated Mar. 11, 2019, 9 pages.
Manane et al., Accurate State of Charge Assessment of Lithium-manganese Dioxide Primary Batteries, Journal of Power Sources, vol. 359, (Aug. 15, 2017), pp. 422-426.

* cited by examiner

SOC vs. P.SOC
(P.SOC=predicted SOC from Equation 1)

SOC vs. ($\Delta S$, $\Delta H$) linear relationship $$SOC = \alpha + \beta \Delta S + \gamma \Delta H$$

| Battery # | $\alpha$ | $\beta$ | $\gamma$ | $R^2$ |
|---|---|---|---|---|
| 4 | -651.656 | 0.34882 | -4.6926 | 0.9707 |
| 5 | -665.271 | 0.3684 | -4.78101 | 0.9708 |
| 6 | -590.01 | 0.3527 | -4.3024 | 0.965 |
| 7 | -577.78 | 0.4225 | -4.26003 | 0.981 |
| Average | -621.76 | 0.3708 | -4.5109 | 0.9733 |

FIG. 14

$$SOC = \alpha + \beta \Delta S + \gamma \Delta H$$

| Battery # | α | β | γ | R² |
|---|---|---|---|---|
| 5 | -333.008 | 1.8823 | -3.1393 | 0.989 |
| 6 | -400.687 | 1.5006 | -3.513 | 0.988 |
| 7 | -397.041 | 1.535 | -3.494 | 0.987 |
| 8 | -385.689 | 1.5611 | -3.423 | 0.987 |
| Average | -383.194 | 1.595 | -3.414 | 0.987 |

FIG.27

$$SOC = f(\Delta S, \Delta H)$$

- $SOC = -1800 + 1{,}611\,(\Delta S) - 6{,}627\,(\Delta H)$
- $R^2 = 0{,}9982$

ΔH=f(ΔS)

• ΔH=-287.80597+0.16008 ΔS
• R²=0.99429

SOC vs. ($\Delta S$, $\Delta H$) linear relationship
SOC= $\alpha$ +$\beta\Delta S$ +$\gamma\Delta H$

| Battery # | $\alpha$ | $\beta$ | $\gamma$ | $R^2$ |
|---|---|---|---|---|
| 1 | -471.6797 | 0.4299 | -1.4449 | 0.989 |
| 2 | -422.2317 | 0.7183 | -1.3118 | 0.994 |
| 3 | -438.1669 | 0.3607 | -1.3688 | 0.991 |
| 4 | -446.4292 | 0.6986 | -1.3734 | 0.994 |
| 5 | -423.5849 | 0.4894 | -1.3335 | 0.994 |

FIG. 37

METHOD AND SYSTEM FOR ASSESSING A STATE OF CHARGE/DISCHARGE (SOC/SOD) FOR AN ELECTROCHEMICAL CELL

CROSS-REFERENCE TO RELATED APPLICATIONS

This application is a national phase entry under 35 U.S.C. § 371 of International Patent Application PCT/IB2018/059751, filed Dec. 7, 2018, designating the United States of America and published as International Patent Publication WO 2019/111220 A1 on Jun. 13, 2019, which claims the benefit under Article 8 of the Patent Cooperation Treaty to Singapore Patent Application Serial No. 10201710152T, filed Dec. 7, 2017.

TECHNICAL FIELD

The present disclosure relates to a method for assessing a state of charge/discharge (SOC/SOD) for an electrochemical cell. It is also related to a system for assessing a state of charge/discharge (SOC/SOD) for an electrochemical cell.

BACKGROUND

State of charge of batteries (SOC) is an important factor for the battery user in order to know the remaining unused capacity and to predict the battery end of service under a specific discharge load.

SOC should be determined accurately in both primary (non-rechargeable) and secondary (rechargeable) batteries. Currently, the main SOC determination methods are based on:

Coulomb counting using the equation:

$$SOC(t)=SOC(0) \pm \int_0^t i(\tau) d\tau, \text{ where}$$

The ± sign is (−) during discharge of a primary and a secondary battery and,

The ± sign is (+) during charge of a secondary battery and, i(τ)=discharge and charge current and t=time Kalman filter (KF) and Extended Kaman Filter (EKF)+ modeling Neural network These methods are empirical and not universal and they don't apply to all batteries.

Alkaline and dry $Zn/MnO_2$ primary batteries are widely used for many applications including in electronics, games, toys, torch, or remote control. $Zn/MnO_2$ cells are economical, practical and easily found all over the world.

Worldwide sales of alkaline and dry cells are expected to reach USD5B and USD2.6B in 2017, respectively. However, there is no reliable method to determine their state of charge (SOC). SOC is an important factor for the battery user in order to know the remaining unused capacity and to predict the battery end of service under a specific discharge load.

More generally, the aim of the present disclosure is to predict the state of charge of electrochemical cells using thermodynamic data measurements.

BRIEF SUMMARY

This objective is reached for rechargeable batteries with a method for assessing a state of charge/discharge (SOC/SOD) for a secondary electrochemical cell, the cell having a first operational mode during which the cell is charged from a power supply connected to terminals of the cell, a second operational mode during which the cell is discharged into a load and a rest mode, the method comprising steps of:

measuring entropy (ΔS) and enthalpy (ΔH) for the electrochemical cell, in the course of the first and second operational modes and during rest, calculating a data representative of the state of charge/discharge (SOC/SOD) according to a first following law:

$$SOC=\alpha+\beta \Delta S+\gamma \Delta H$$

$$SOD=100\%-SOC$$

with parameters α, β and γ depending on chemical data and on the state of health (SOH) of the electrochemical cell.

Entropy and enthalpy are determined by the temperature dependence of open-circuit voltage (OCV) at each SOC, according to:

$$\Delta S = nF \frac{\partial OCV(SOC)}{\partial T}$$

$$\Delta H = -nF\left(OCV(SOC) - T\frac{\partial OCV(SOC)}{\partial T}\right),$$

where n is the number of electrons involved in the elemental electrode redox process. For example, n=1 for H, Li, Na, K . . . , n=2 for Mg, Ca, Zn, Cd, Fe . . . and n=3 for B, Al, Fe . . . .

The above-cited objective is further reached for alkaline and dry cells with a method for assessing a state of discharge (SOD) for a primary electrochemical cell, the cell having an operational mode during which the cell is discharged into a load and a rest mode, the method comprising steps of:

measuring entropy (ΔS) and enthalpy (ΔH) for the electrochemical cell, in the course of the operational mode and during rest, calculating a data representative of the state of discharge (SOD) according to a following law:

$$SOD=\alpha'+\beta' \Delta S+\gamma' \Delta H$$

with parameters α', β' and γ' depending on chemical data and on the state of health (SOH) of the electrochemical cell.

The SOC/SOD assessment method according to the present disclosure can be implemented for assessing a state of discharge (SOD) for aqueous or organic lithium cells, and for a rechargeable cell like lithium-ion, NiMH, NiCd, or NaS, sodium-ion, solid state lithium rechargeable cell, redox flow batteries.

The SOC/SOD assessment method according to the present disclosure can be advantageously applied for predicting a state of discharge (SOD) for primary (non-rechargeable) cells such as $Li/MnO_2$ cells, $Li/FeS_2$ cells, $Li/CF_X$ cells, alkaline cells, Zinc Carbon dry cells and metal-air cells.

In an advantageous version of the present disclosure, the SOC/SOD assessment method according of the present disclosure is implemented online via an integrated circuit having temperature, current and voltage probes, the integrated circuit being attached to or imbedded in the electrochemical cell. Furthermore, the integrated circuit is a chip provided with computing and/or micro-processing capabilities, and with RF communication capabilities.

Entropy (ΔS) and enthalpy (ΔH) are preferably determined by a temperature dependence of open-circuit voltage (OCV) across the electrochemical cell terminals for each state of charge (SOC) value, according to:

$$\Delta S = nF \frac{\partial OCV(SOC)}{\partial T}$$

$$\Delta H = -nF\left(OCV(SOC) - T\frac{\partial OCV(SOC)}{\partial T}\right)$$

In another embodiment of the present disclosure, there is proposed a method for assessing a state of health (SOH) for a secondary electrochemical cell, the cell having a first operational mode during which the cell is charged from a power supply connected to terminals of the cell, a second operational mode during which the cell is discharged into a load and a rest mode, the method comprising steps of:
- measuring entropy ($\Delta S$) and enthalpy ($\Delta H$) for the electrochemical cell, in the course of the first and second operational modes and during rest,
- measuring the state of charge/discharge (SOC/SOD) for the electrochemical cell, in the course of the first and second operational modes and during rest,
- identifying, from the measured entropy ($\Delta S$), measured enthalpy ($\Delta H$) and measured state of charge/discharge (SOC/SOD), parameters $\alpha$, $\beta$ and $\gamma$ according to following laws:

SOC=$\alpha$+$\beta\Delta S$+$\gamma\Delta H$

SOD=100%−SOC

- deriving the state of health (SOH) from the identified parameters $\alpha$, $\beta$ and $\gamma$ and from chemical data attached to the electrochemical cell.

In an advantageous version of the present disclosure, the SOH assessment method according to the present disclosure is implemented online via an integrated circuit having temperature, current and voltage probes, the integrated circuit being attached to or imbedded in the electrochemical cell. Furthermore, the integrated circuit is a chip provided with computing and/or micro-processing capabilities, and with RF communication capabilities.

According to another aspect of the present disclosure, a system is proposed for assessing a state of charge/discharge (SOC/SOD) for a secondary or rechargeable electrochemical cell, the cell having a first operational mode during which the cell is charged from a power supply connected to terminals of the cell, a second operational mode during which the cell is discharged into a load and a rest mode, the system comprising:
- means for measuring entropy ($\Delta S$) and enthalpy ($\Delta H$) for the electromechanical cell, in the course of the first and second operational modes and during rest,
- means for calculating a data representative of the state of charge/discharge (SOC/SOD) according to the following laws:

SOC=$\alpha$+$\beta\Delta S$+$\gamma\Delta H$

SOD=100%−SOC with parameters $\alpha$, $\beta$ and $\gamma$ depending on chemical data and on the state of health (SOH) of the electrochemical cell.

In another embodiment of the present disclosure, a system is proposed for assessing a state of discharge (SOD) for a primary electrochemical cell, the cell having an operational mode during which the cell is discharged into a load and a rest mode, the system comprising:
- means for measuring entropy ($\Delta S$) and enthalpy ($\Delta H$) for the electromechanical cell, in the course of the operational mode and during rest,
- means for calculating a data representative of the state of discharge (SOD) according to a following law:

SOD=$\alpha$'+$\beta$'$\Delta S$+$\gamma$'$\Delta H$ with parameters $\alpha$', $\beta$' and $\gamma$' depending on chemical data and on the state of health (SOH) of the electrochemical cell.

The SOC/SOD assessment system according to the present disclosure can further comprise an integrated circuit connected to temperature and voltage probes attached to or embedded in the electrochemical cell. This integrated circuit can advantageously implement the calculating means and comprise a telecommunication means.

The integrated circuit can advantageously implement calculating entropy ($\Delta S$) and enthalpy ($\Delta H$) as a temperature dependence of open-circuit voltage (OCV) across the electrochemical cell terminals for each state of charge (SOC) value, according to:

$$\Delta S = nF\frac{\partial OCV(SOC)}{\partial T}$$

$$\Delta H = -nF\left(OCV(SOC) - T\frac{\partial OCV(SOC)}{\partial T}\right)$$

According to another aspect of the present disclosure, a system is proposed for assessing a state of health (SOH) for a secondary electrochemical cell, the cell having a first operational mode during which the cell is charged from a power supply connected to terminals of the cell, a second operational mode during which the cell is discharged into a load and a rest mode, the system comprising:
- means for measuring entropy ($\Delta S$) and enthalpy ($\Delta H$) for the electrochemical cell, in the course of the first and second operational modes and during rest,
- means for measuring the state of charge/discharge (SOC/SOD) for the electrochemical cell, in the course of the first and second operational modes and during rest,
- means for identifying, from the measured entropy ($\Delta S$), measured enthalpy ($\Delta H$) and measured state of charge/discharge (SOC/SOD), parameters $\alpha$, $\beta$ and $\gamma$ according to following laws:

SOC=$\alpha$+$\beta\Delta S$+$\gamma\Delta H$

SOD=100%−SOC

- means for deriving the state of health (SOH) from the identified parameters $\alpha$, $\beta$ and $\gamma$ and from chemical data attached to the electrochemical cell.

According to another aspect of the present disclosure, a method and a system are proposed for assessing a state of health (SOH) for a primary (non-rechargeable) electrochemical cell, the cell having an operational mode during which the cell is discharged into a load and a rest mode, the method comprising steps of:
- measuring entropy ($\Delta S$) and enthalpy ($\Delta H$) for the electrochemical cell, in the course of the operational mode and during rest,
- calculating a data representative of the state of discharge (SOD) according to a following law:

SOD=$\alpha$'+$\beta$'$\Delta S$+$\gamma$'$\Delta H$ with parameters $\alpha$', $\beta$' and $\gamma$' depending on chemical data and on the state of health (SOH) of the electrochemical cell.

According to yet another aspect of the present disclosure, a system is proposed for fast-charging a rechargeable battery, the battery having terminals connected to internal electrochemical cell electrodes with (i) a first operational mode during which the cell is charged from a power supply connected to terminals of the cell, (ii) a second operational mode during which the cell is discharged into a load and (iii) a rest mode, the fast-charging system comprising:

a power supply positioned in electrical communication with the electrodes for providing a controllable time varying charging voltage applied to the battery terminals, thereby generating a charging current resulting in charging of the electrochemical cells from the initial state of charge ($SOC_i$) to a state-of-charge target value ($SOC_f$), a charging-control processor for controlling the power supply, a unit for assessing the state of charge (SOC) of the battery, the assessment unit comprising:

means for measuring entropy ($\Delta S$) and enthalpy ($\Delta H$) for the battery, in the course of the first and second operational modes and during rest, means for calculating a data representative of the state of charge (SOC) according to the law:

$$SOC=\alpha+\beta\Delta S+\gamma\Delta H$$

with parameters $\alpha$, $\beta$ and $\gamma$ depending on chemical data and on the state of health (SOH) of the battery.

The SOC assessment unit can advantageously comprise an integrated circuit connected to temperature and voltage probes attached to or embedded in the battery.

BRIEF DESCRIPTION OF THE DRAWINGS

FIG. 27 illustrates SOC vs ($\Delta S$, $\Delta H$) linear relationship, FIG. 37 is a table of parameters $\alpha$, $\beta$, $\gamma$ for several batteries.

DETAILED DESCRIPTION

The SOC/SOD assessment method according to the present disclosure is based on thermodynamics. Entropy ($\Delta S$) and enthalpy ($\Delta H$) are measured in the course of battery operation (charge and discharge) and during rest (no current). A universal law of SOC as function of entropy and enthalpy is established as:

$$SOC=\alpha+\beta\Delta S+\gamma\Delta H \qquad (Eq.1)$$

This law applies to primary and secondary batteries. In this equation 1, parameters $\alpha$, $\beta$ and $\gamma$ depend on the battery chemistry and on the battery state of health (SOH).

Thermodynamics data can be used to determine the SOD of both primary (aqueous and organic lithium) and rechargeable (lithium-ion, NiMH, NiCd, NaS, . . . ) cells with very high accuracy (>97%).

SOD assessment can be made online owing to an IC/chip with highly sensitive temperature (<0.1° C.) and voltage (<0.1 mV) probes.

Two different SOCs cannot have simultaneously the same entropy and enthalpy values. It follows that the ($\Delta S$, $\Delta H$, SOC) trinomial is unique.

Figure 1:
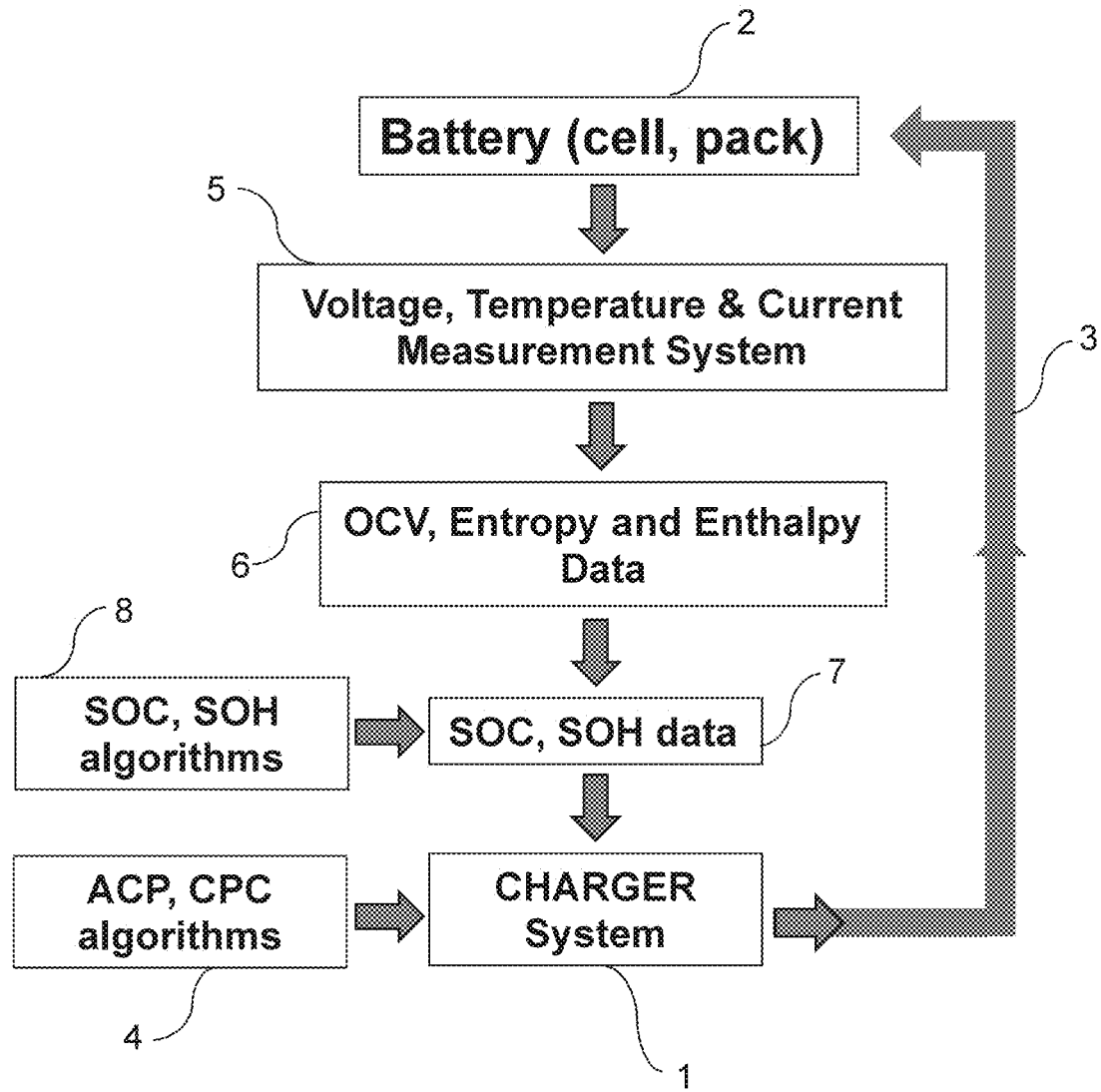
FIG. 1 is a functional scheme of a fast-charging system implementing the SOH-assessment method according to the present disclosure, FIG. 2 features a discharge profile measured on a first experimental test.
Figure 2:
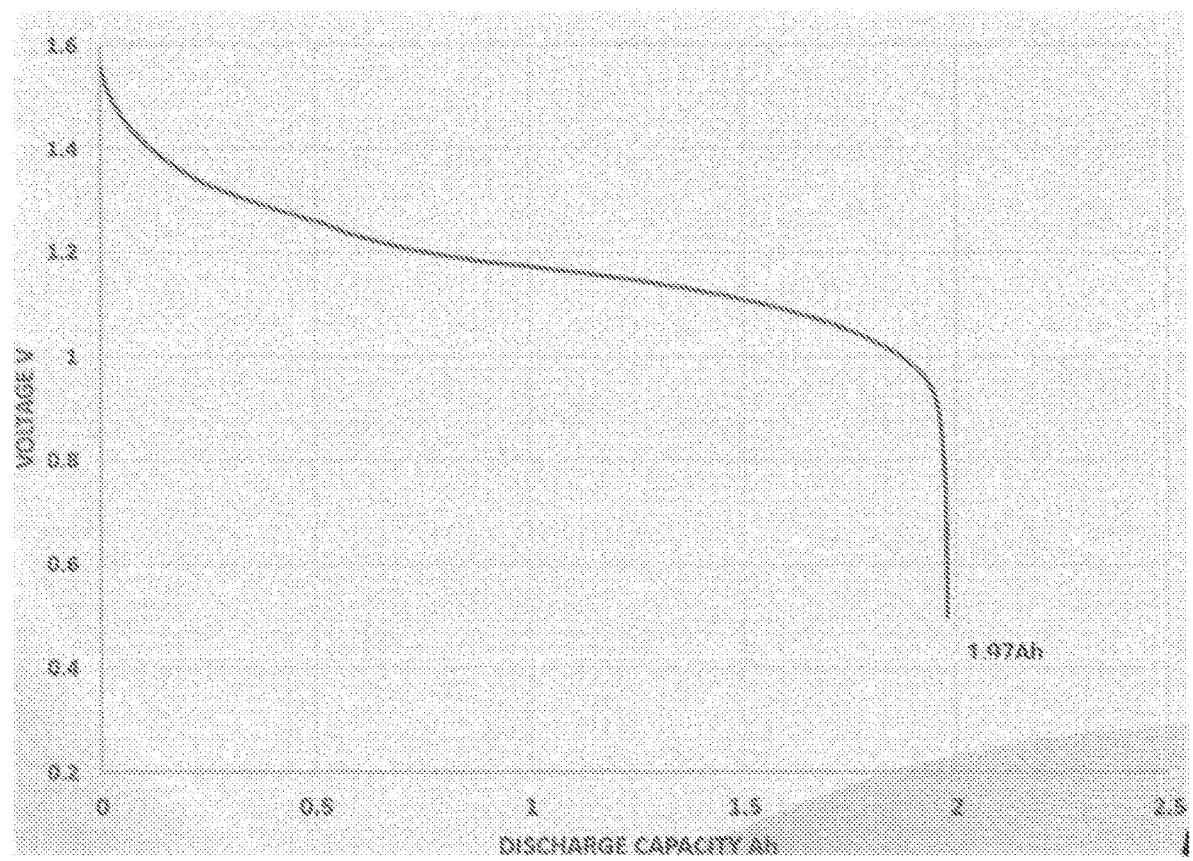
Figure 3:
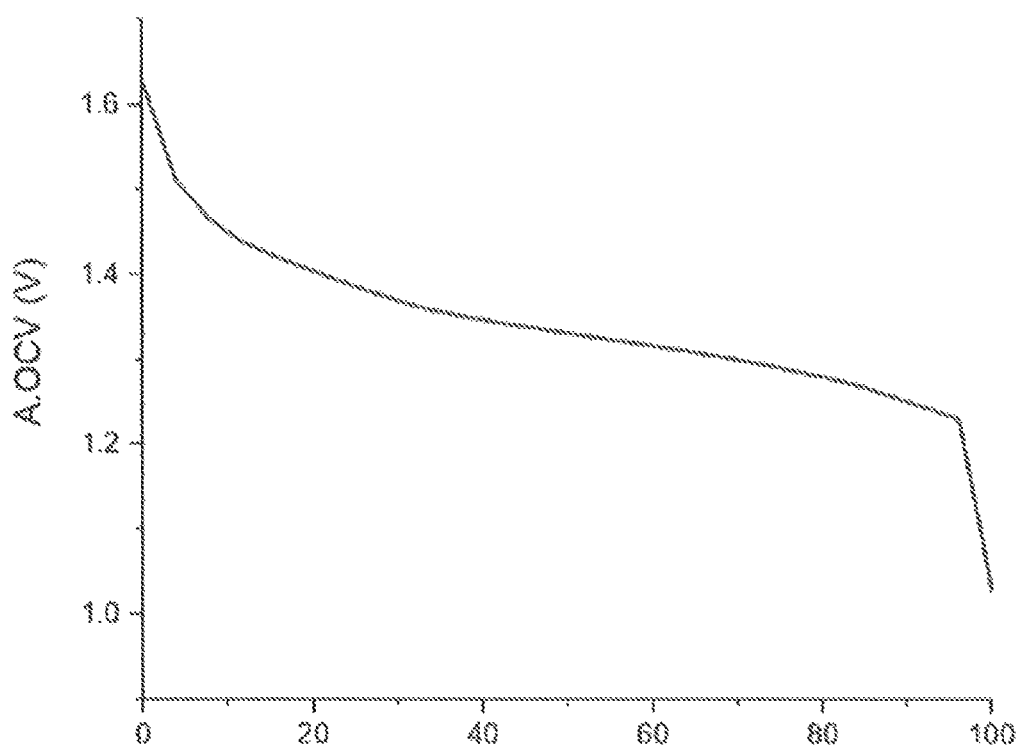
FIG. 3 illustrates an evolution of OCV vs SOD during the experimental test.
Figure 4:
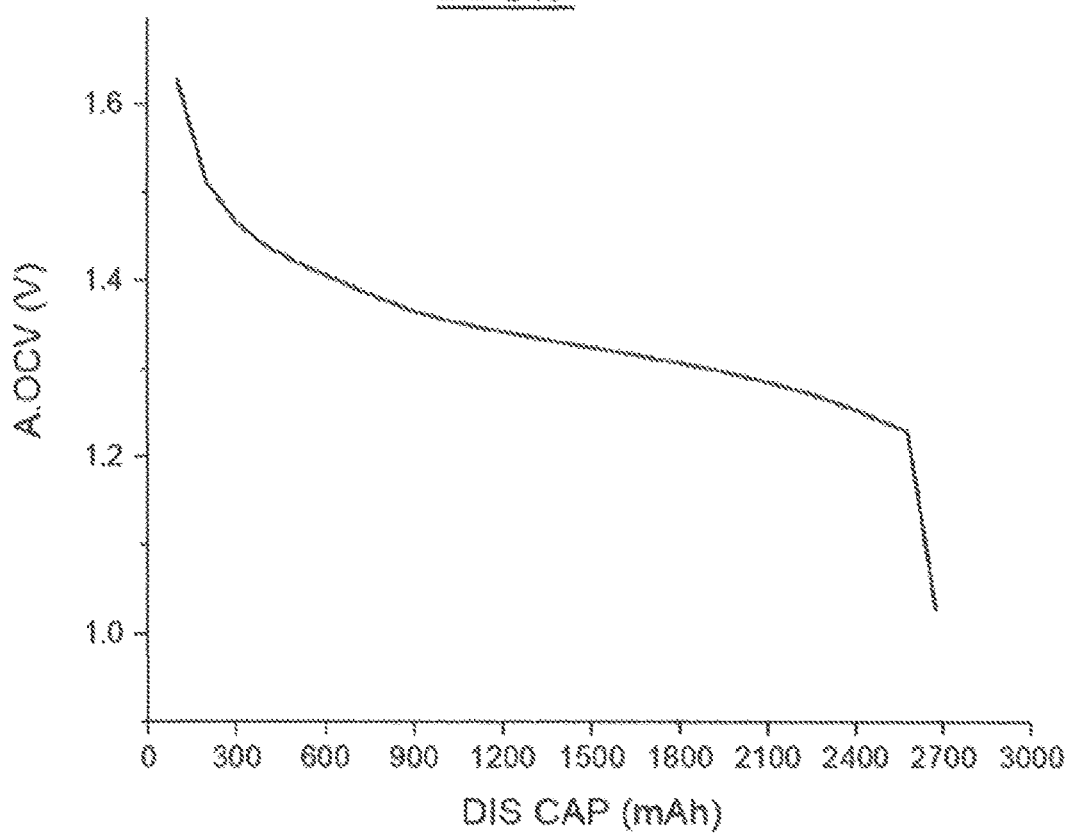
FIG. 4 illustrates an evolution of OCV vs discharge capacity during the experimental test.
Figure 5:
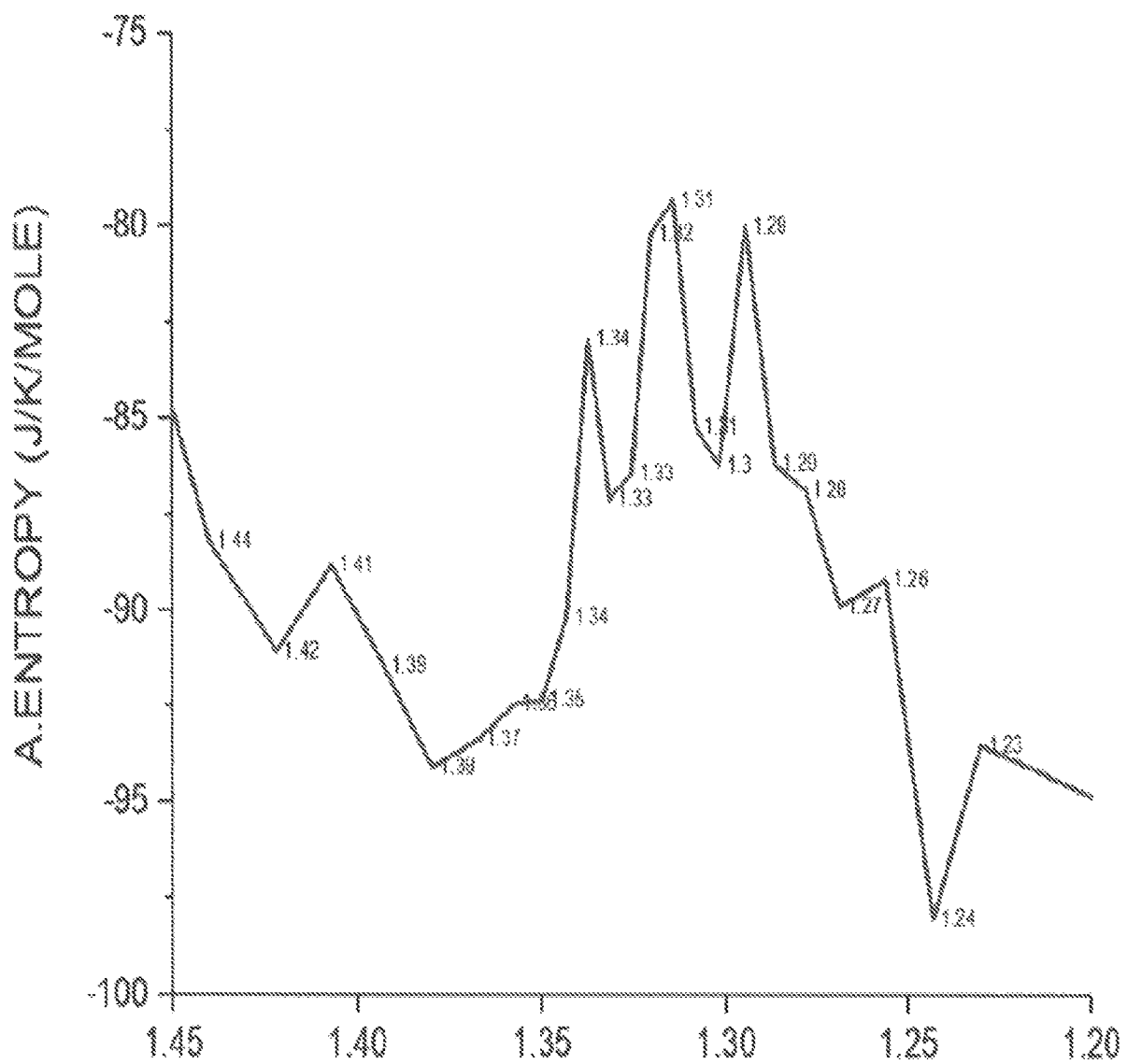
FIG. 5 illustrates an evolution of entropy vs OCV during the experimental test.
Figure 6:
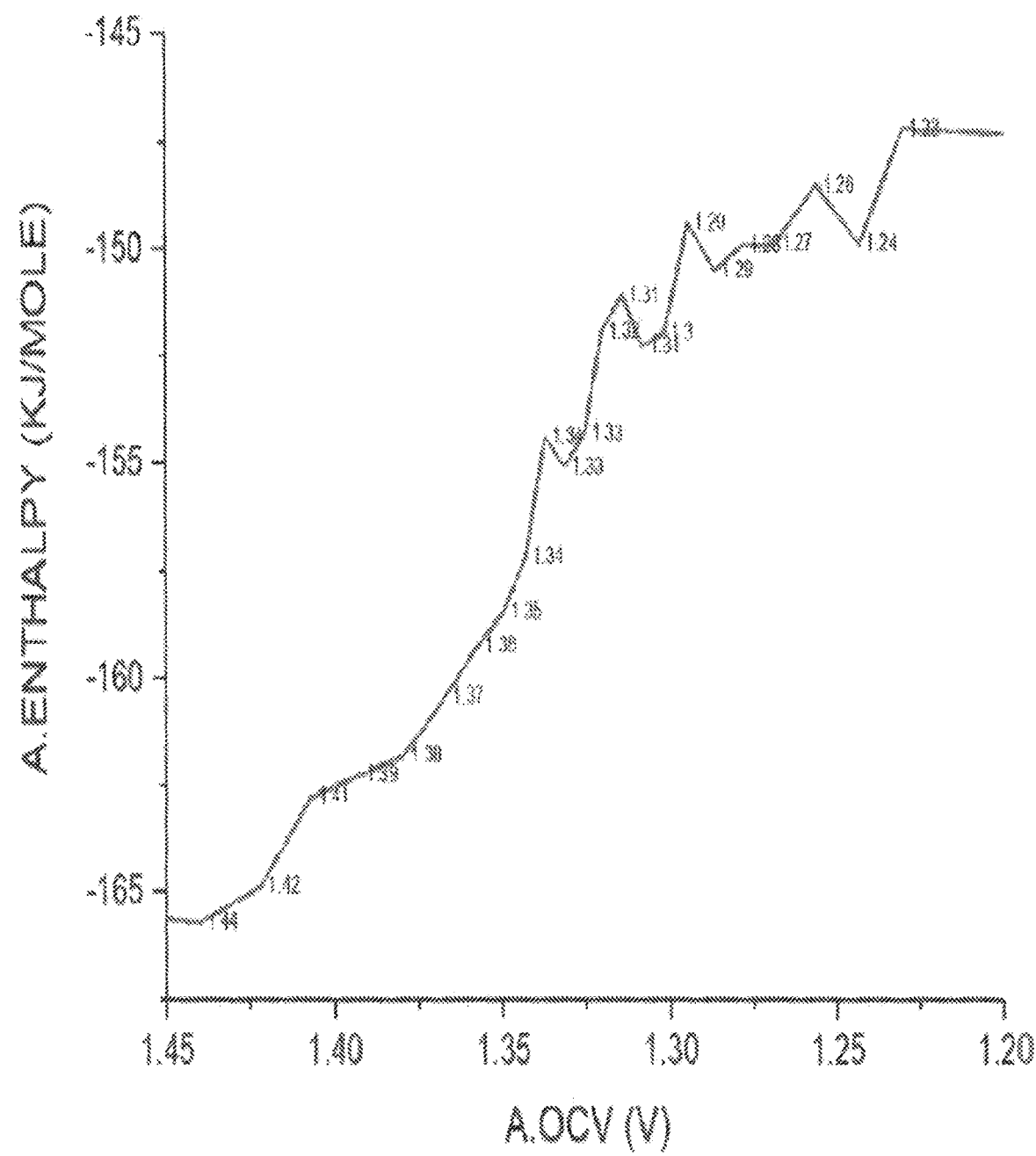
FIG. 6 illustrates an evolution of enthalpy vs OCV during the experimental test.
Figure 7:
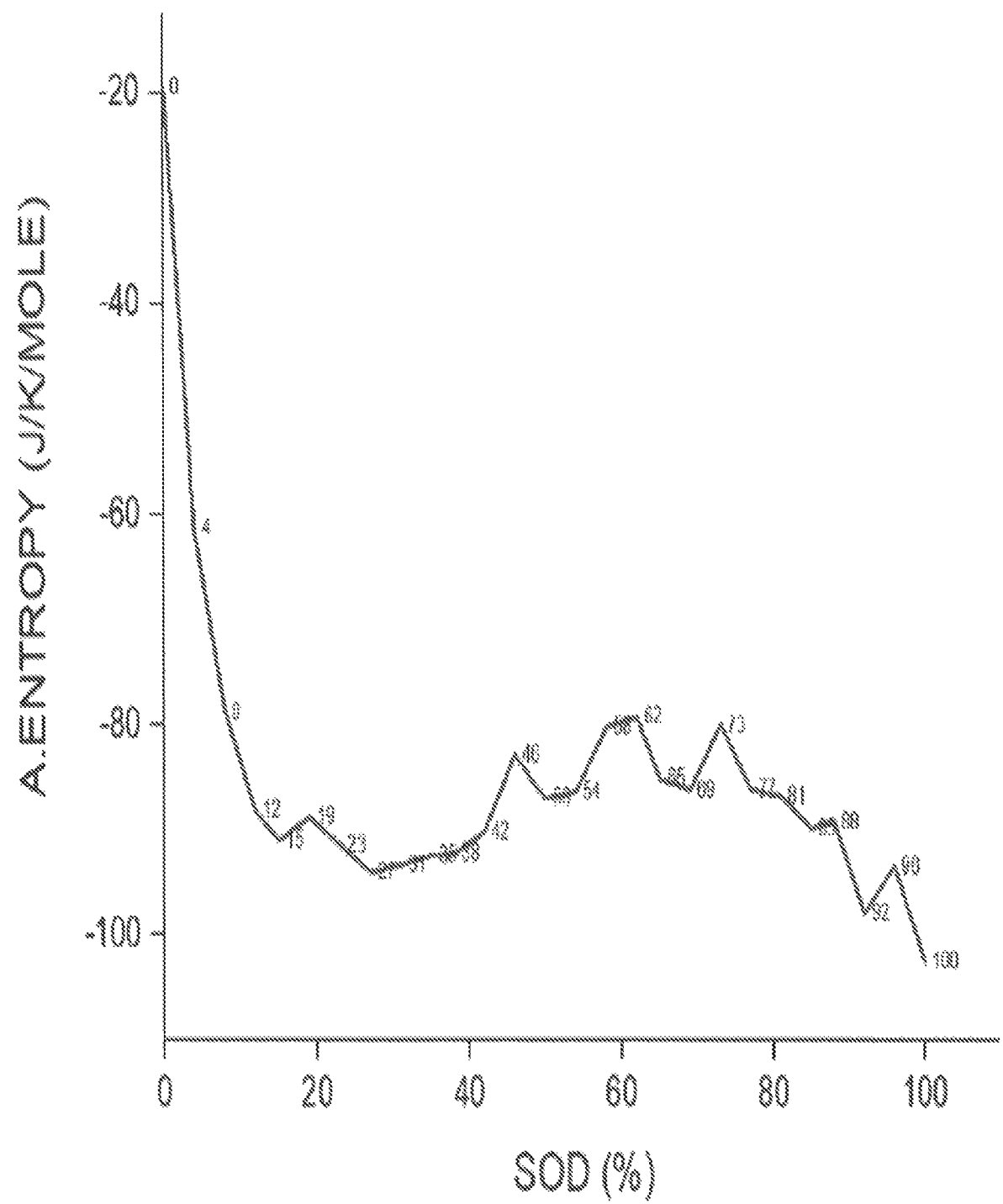
FIG. 7 illustrates an evolution of entropy vs SOD during the experimental test.
Figure 8:
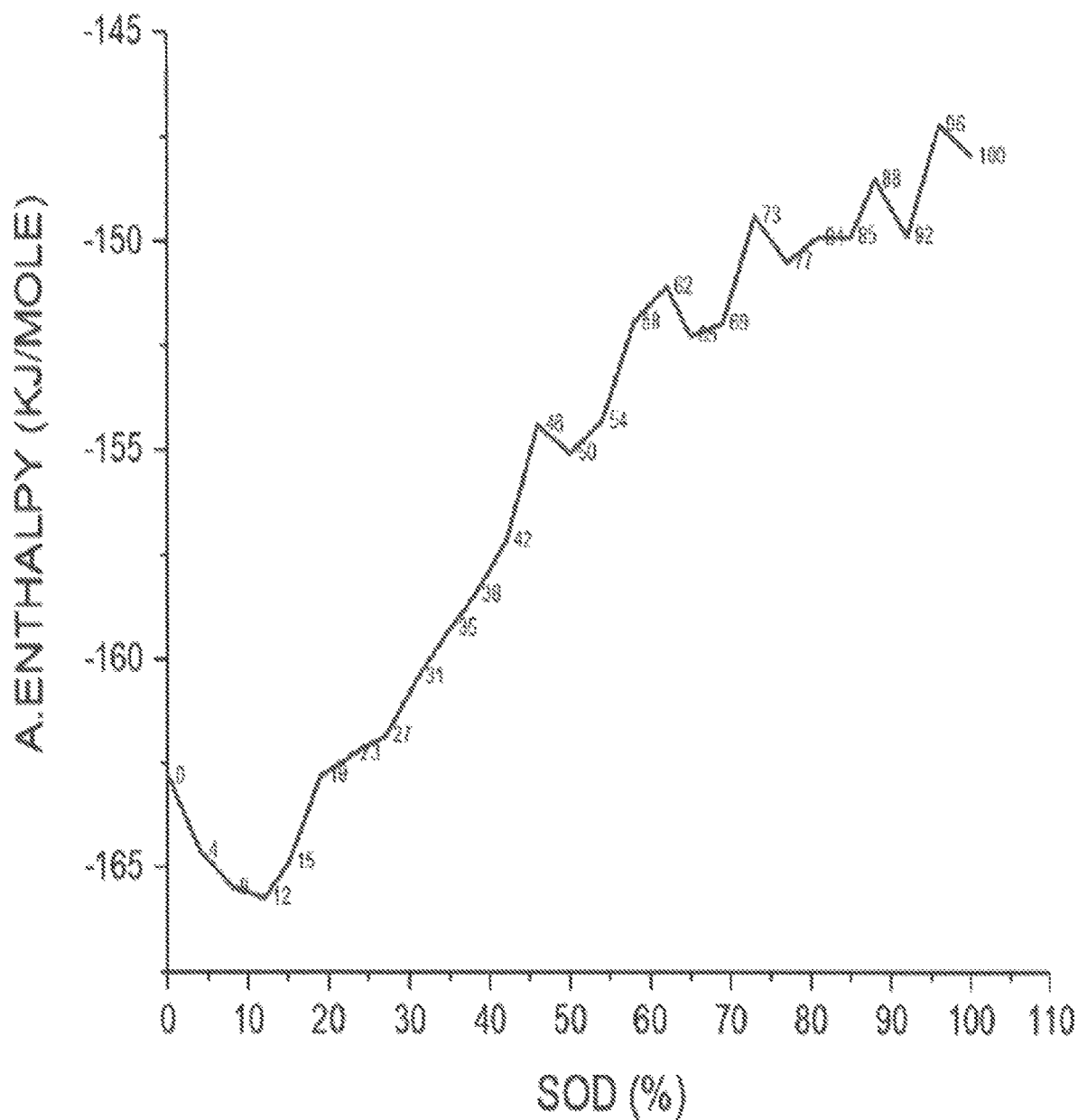
FIG. 8 illustrates an evolution of enthalpy vs SOD during the experimental test.
Figure 9:
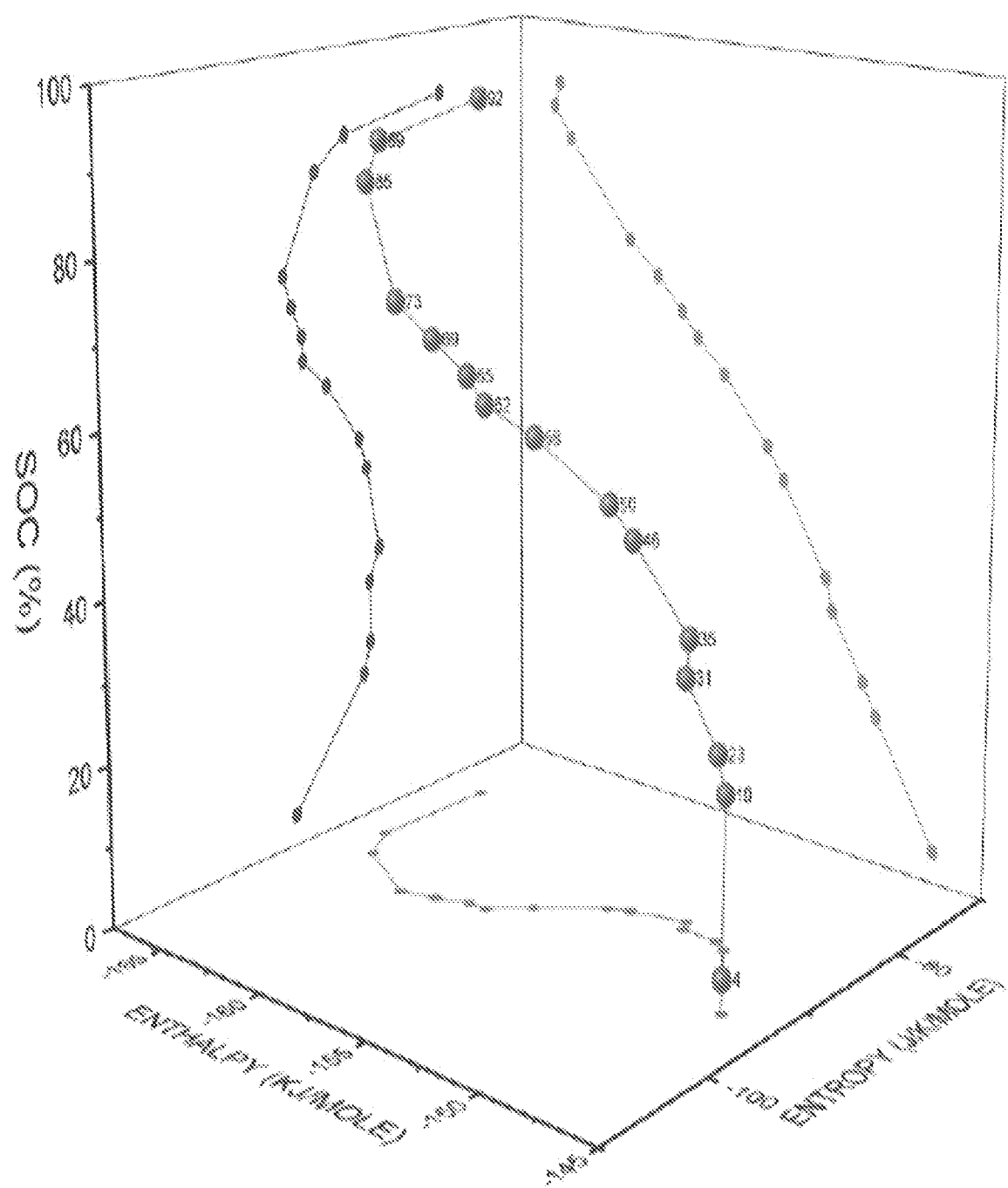
FIG. 9 illustrates SOC-$\Delta S$-$\Delta H$ three-dimensional (3D) plots, FIG. 10 features a projection profile in the $\Delta S$-$\Delta H$ plan, FIG. 11 features a linear regression done between 10 and 90% of the SOC for alkaline cells, FIG. 12 features an evolution of SOC vs predicted SOC, FIG. 13 features an evolution of predicted SOC vs SOC, FIG. 14 features a linear relationship of SOC vs ($\Delta S$, $\Delta H$)
Figure 10:
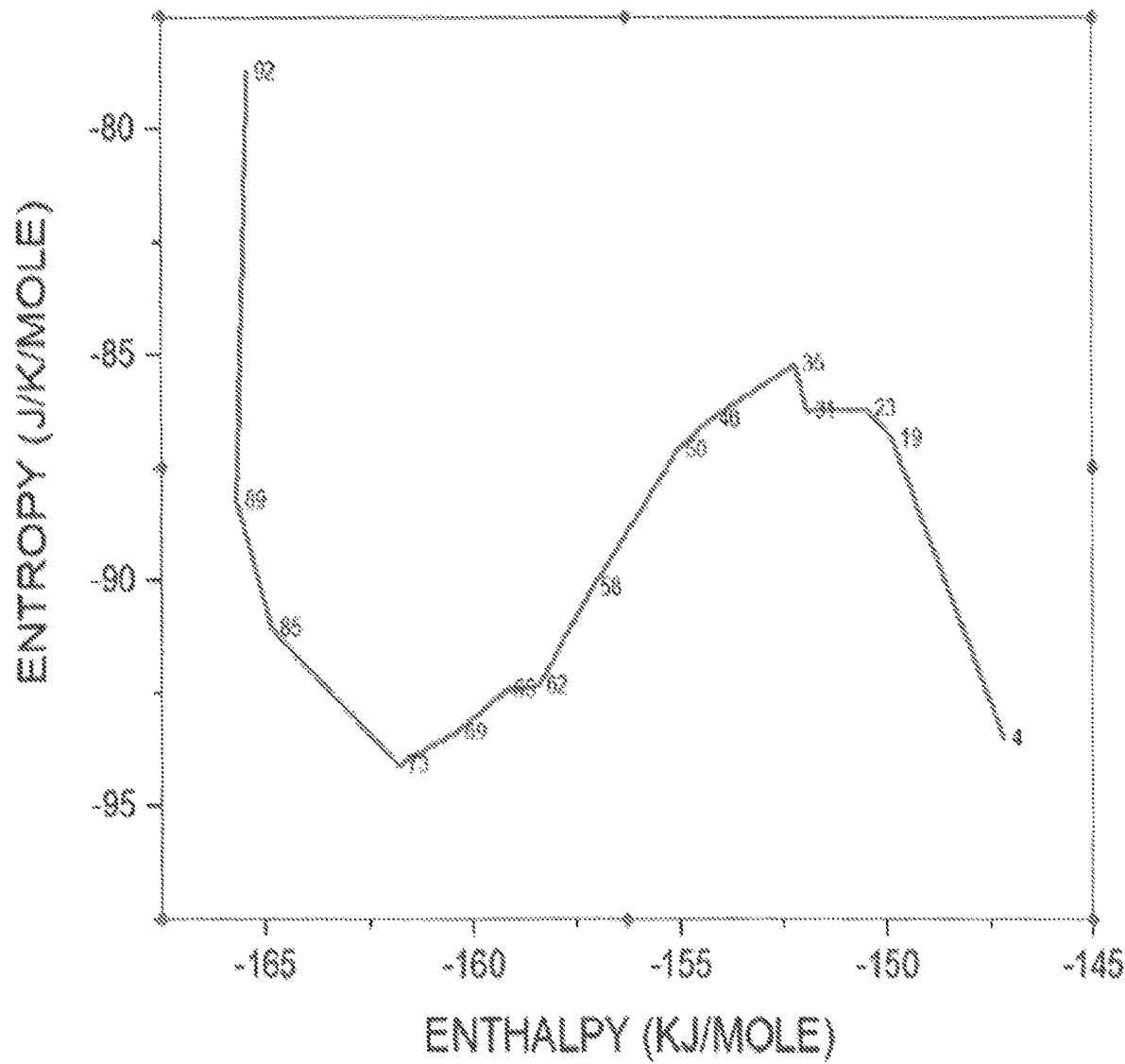
Figure 11:
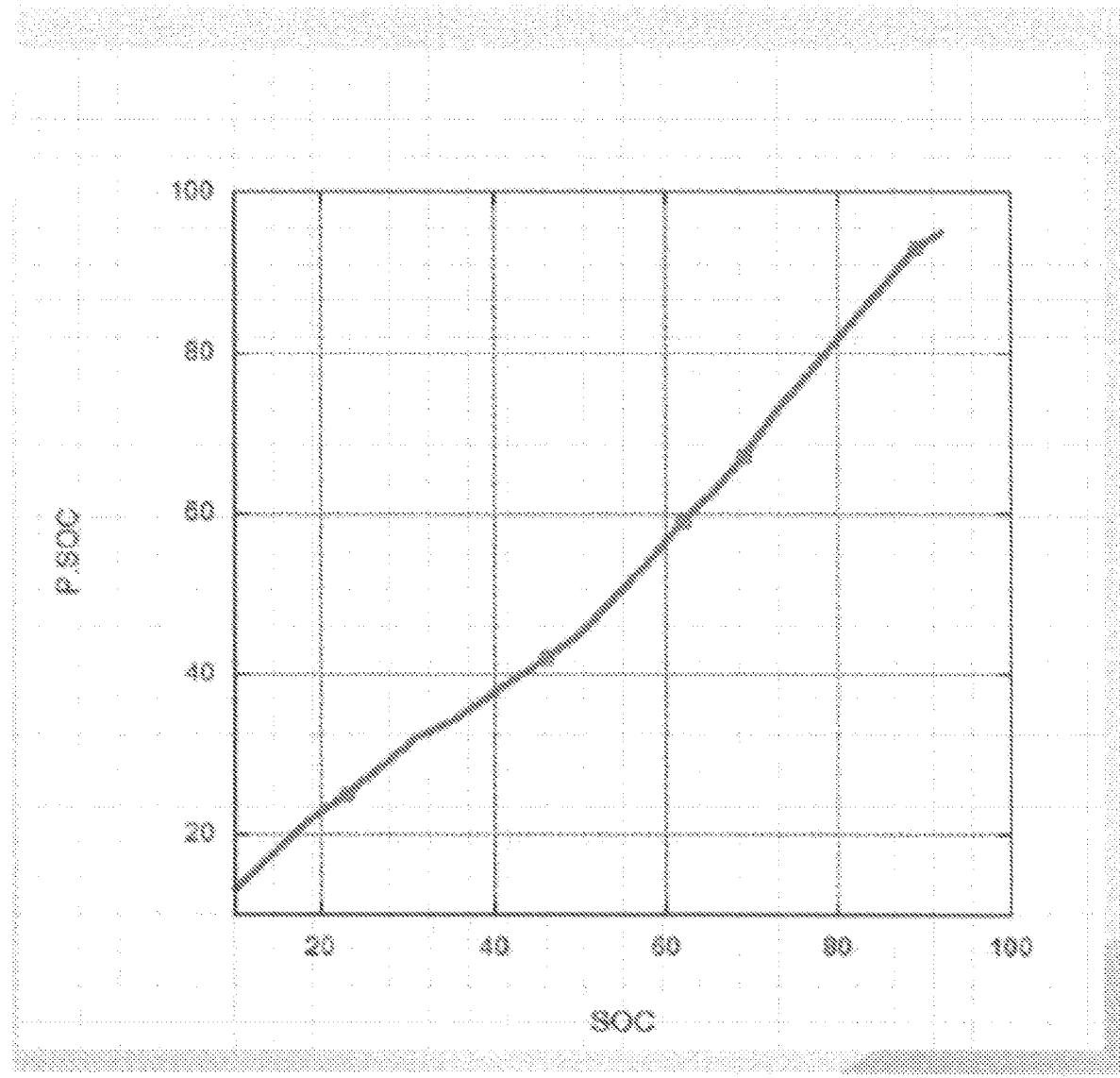
Figure 12:
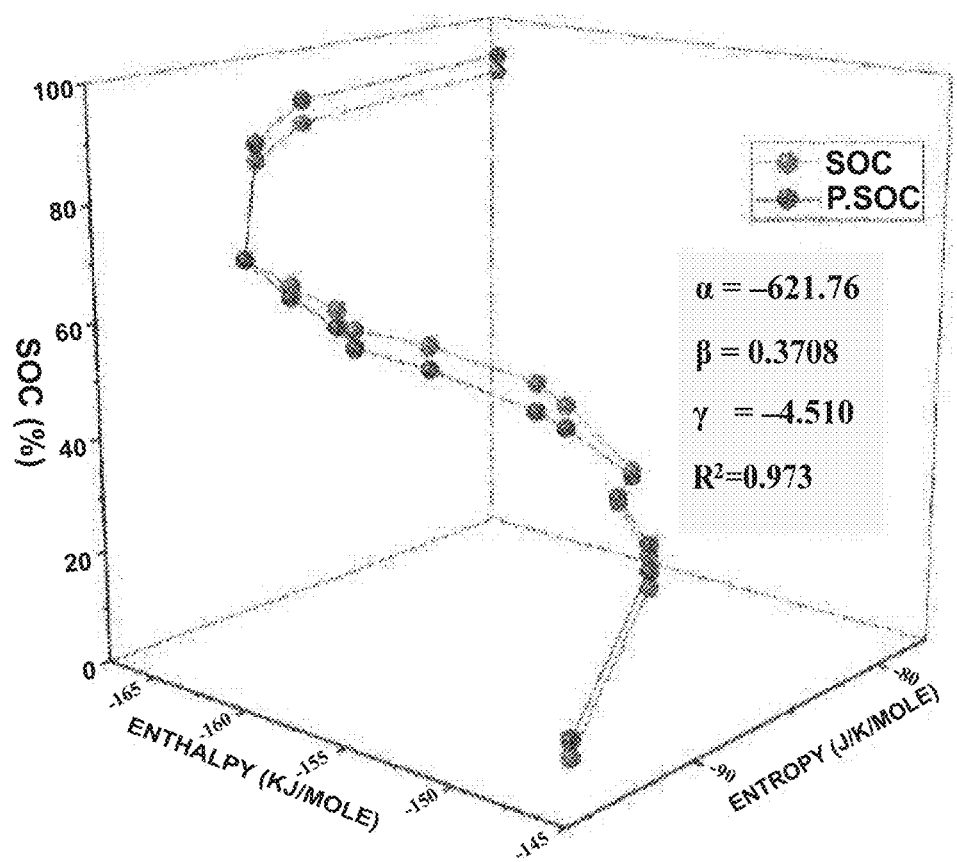
Figure 13:
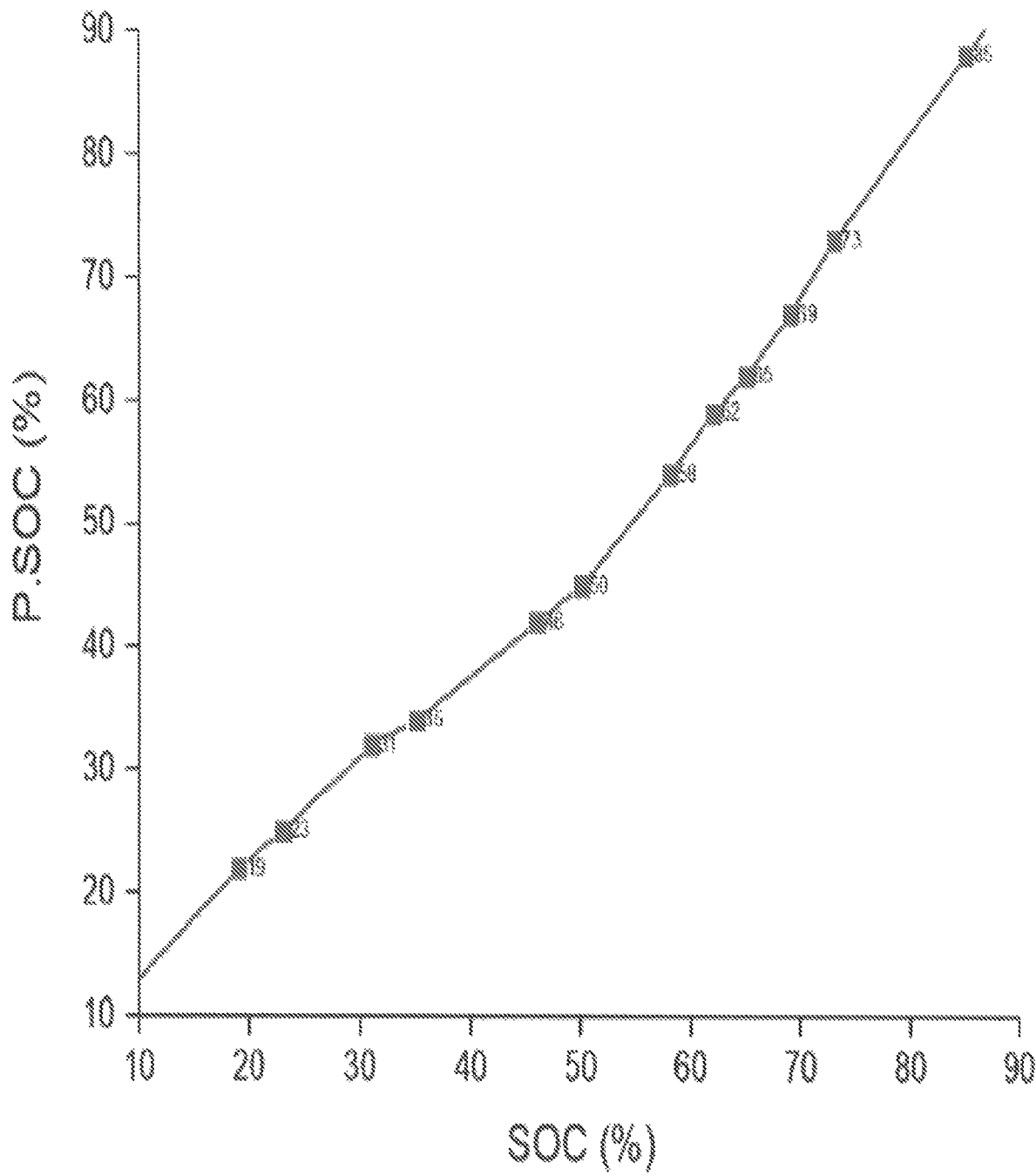
Figure 15:
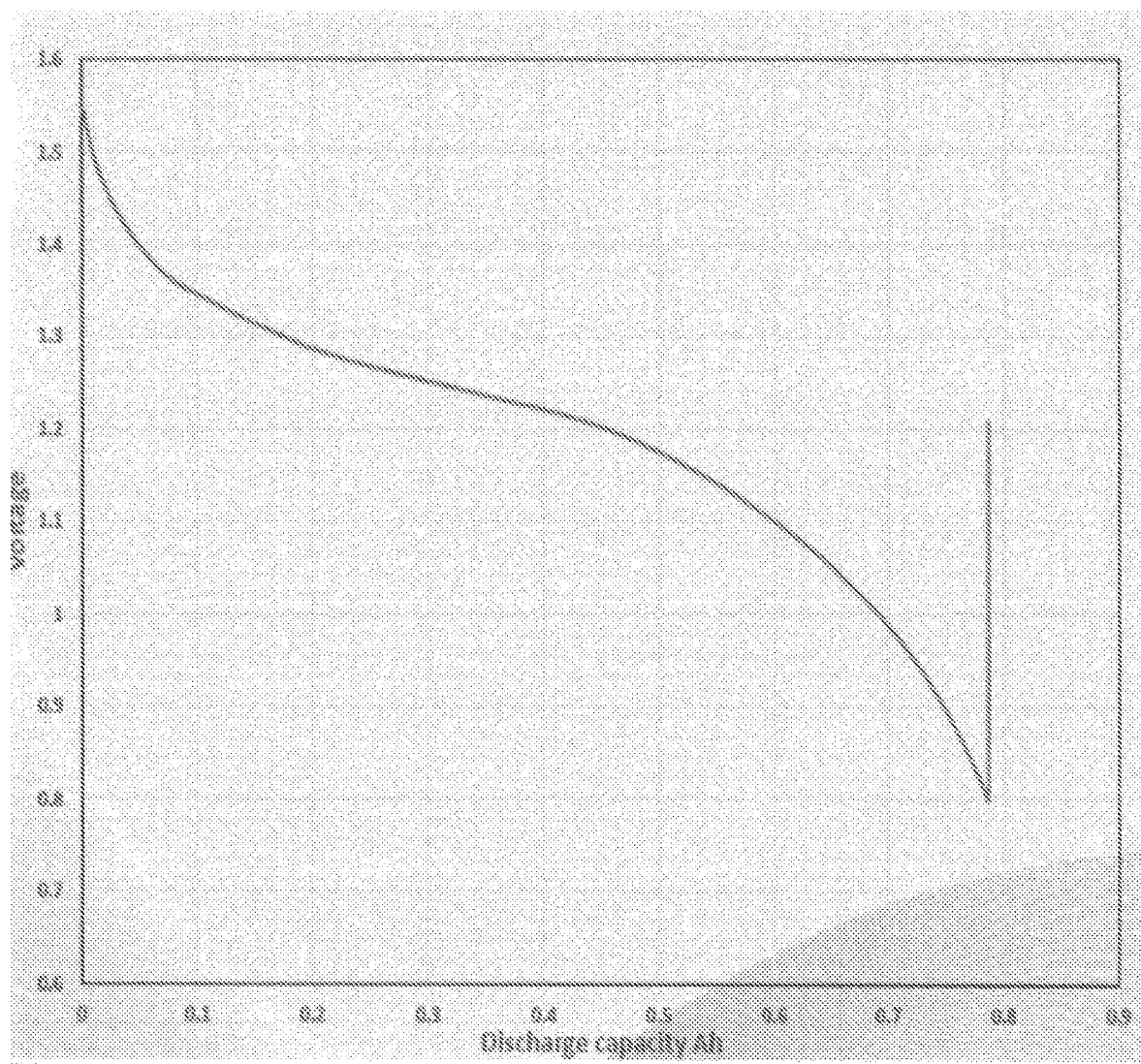
FIG. 15 illustrates a discharge profile measured during a second experimental test.
Figure 16:
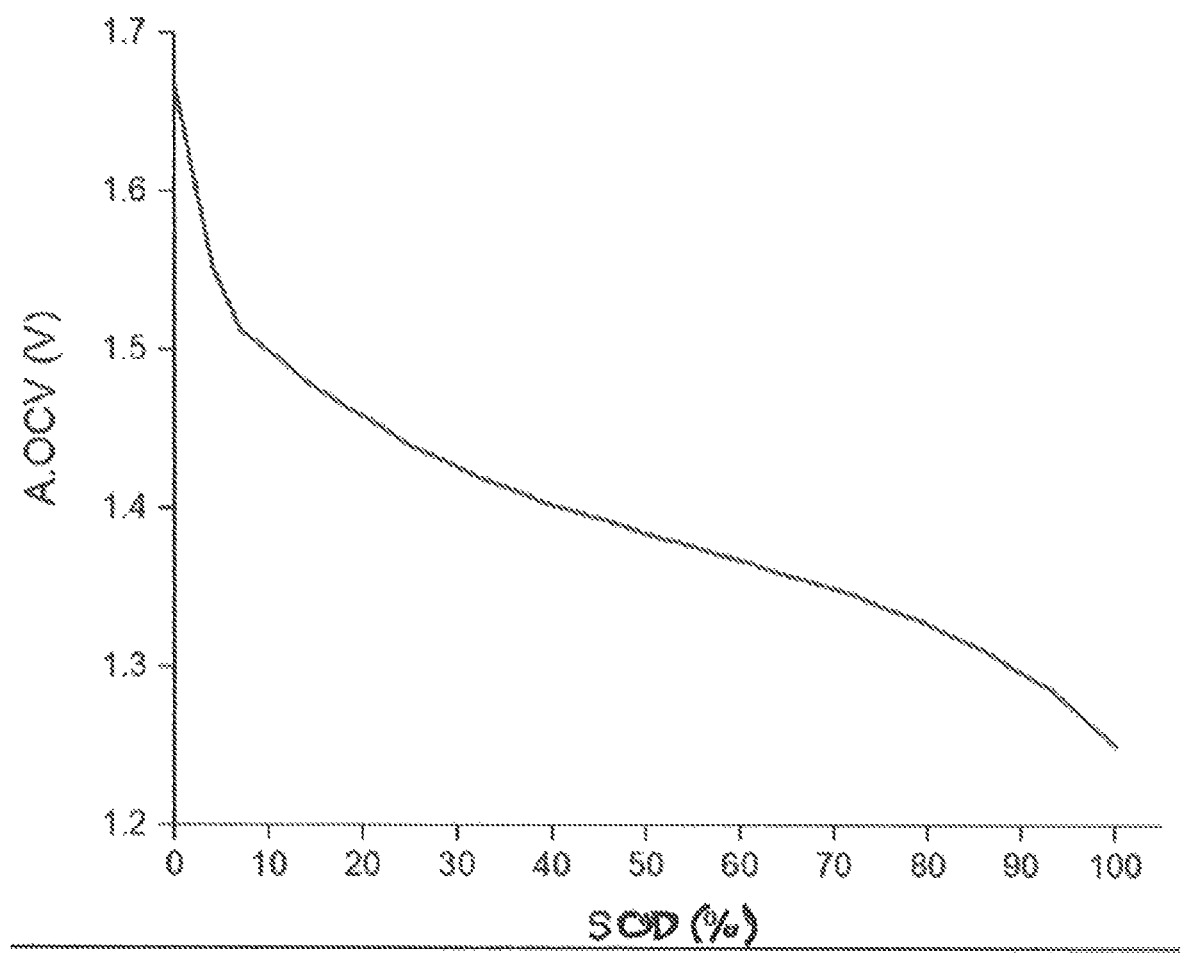
FIG. 16 illustrates an evolution of OCV vs SOD measured during the second experimental test.
Figure 17:
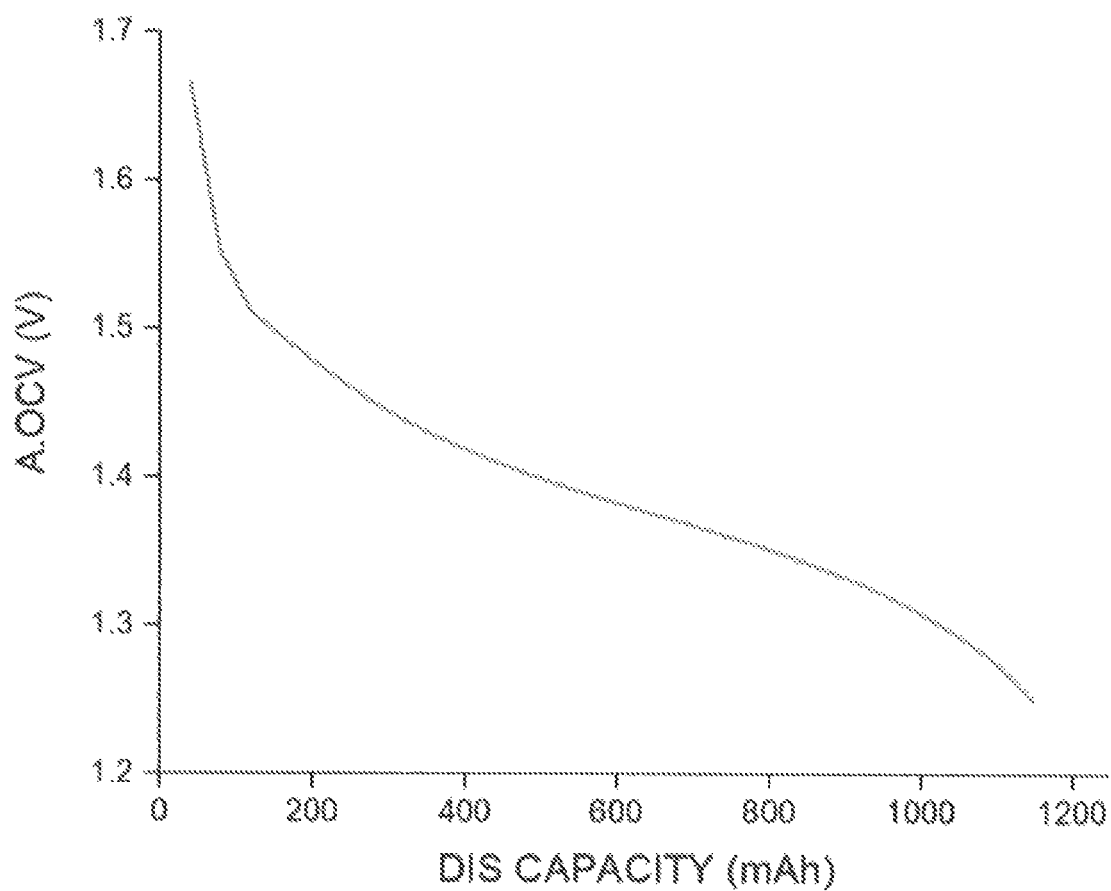
FIG. 17 illustrates an evolution of OCV vs discharge capacity measured during the second experimental test.
Figure 18:
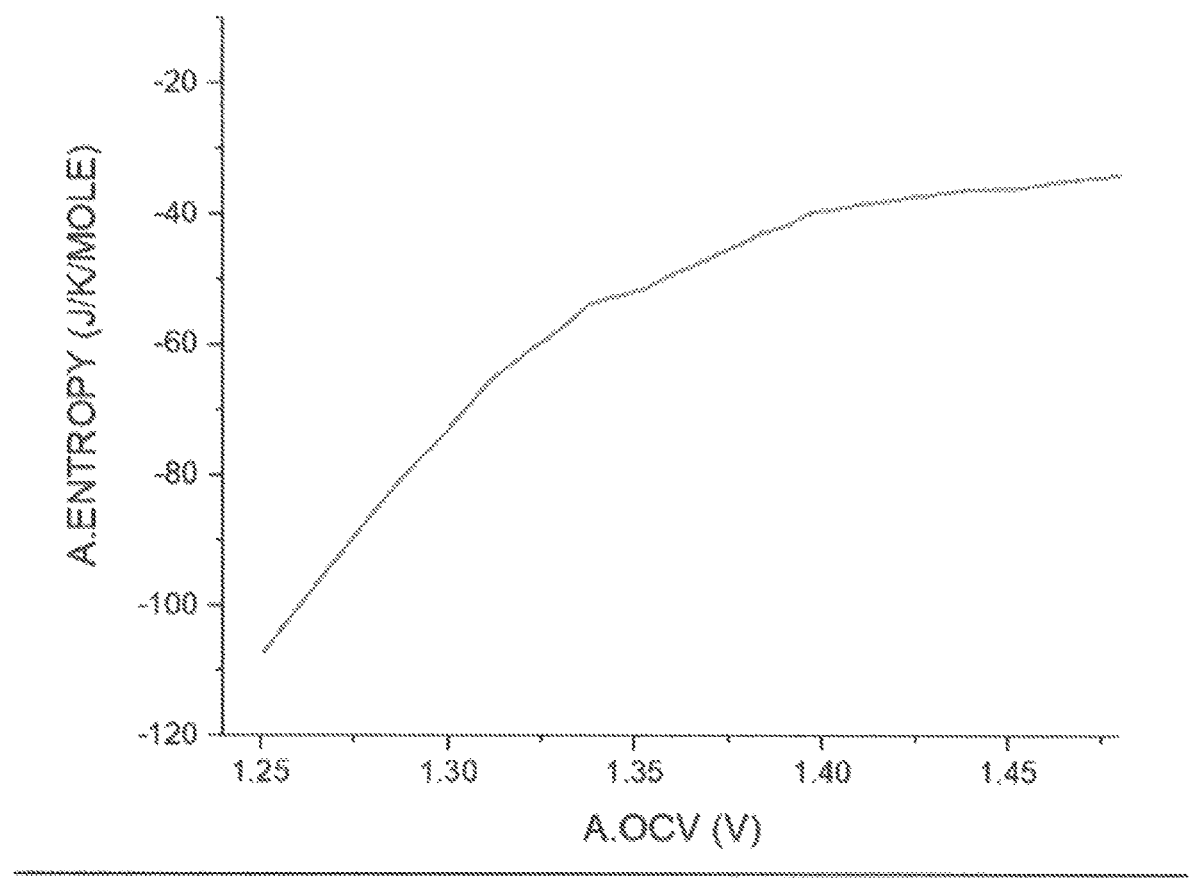
FIG. 18 illustrates an evolution of entropy vs OCV.
Figure 19:
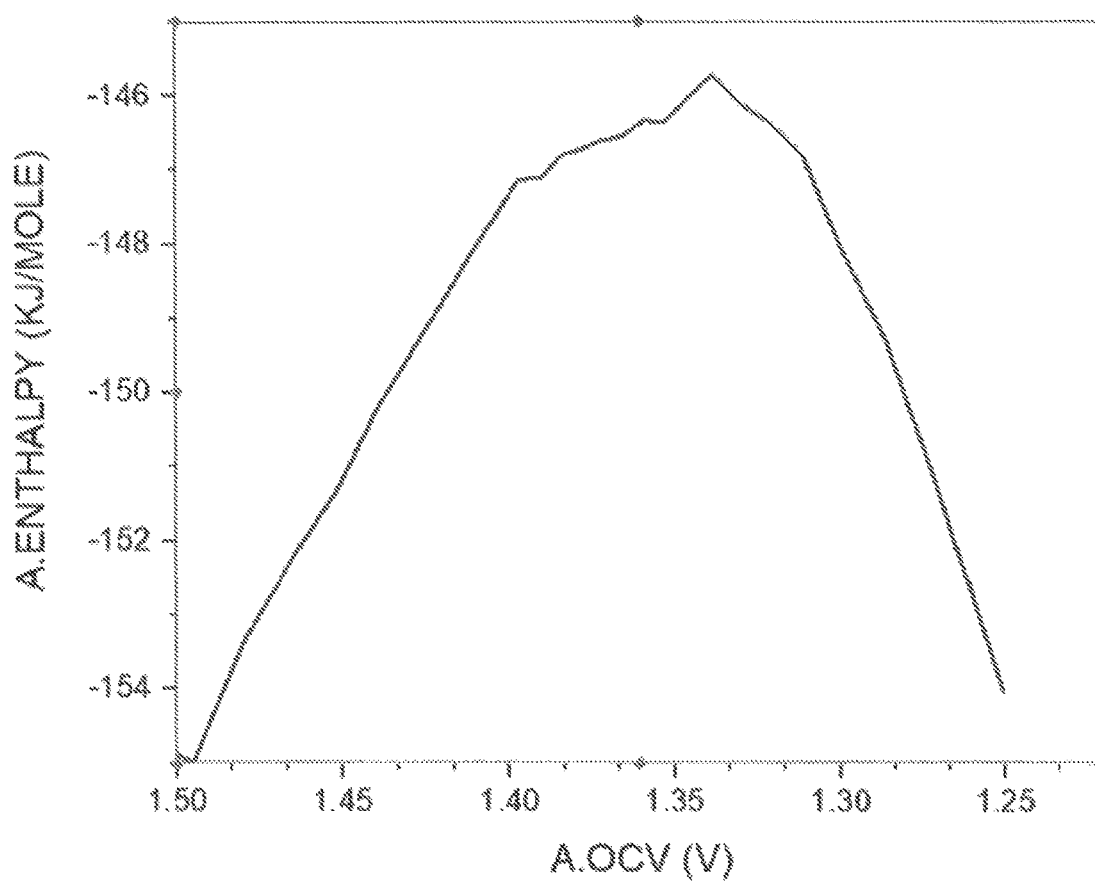
FIG. 19 illustrates an evolution of enthalpy vs OCV.
Figure 20:
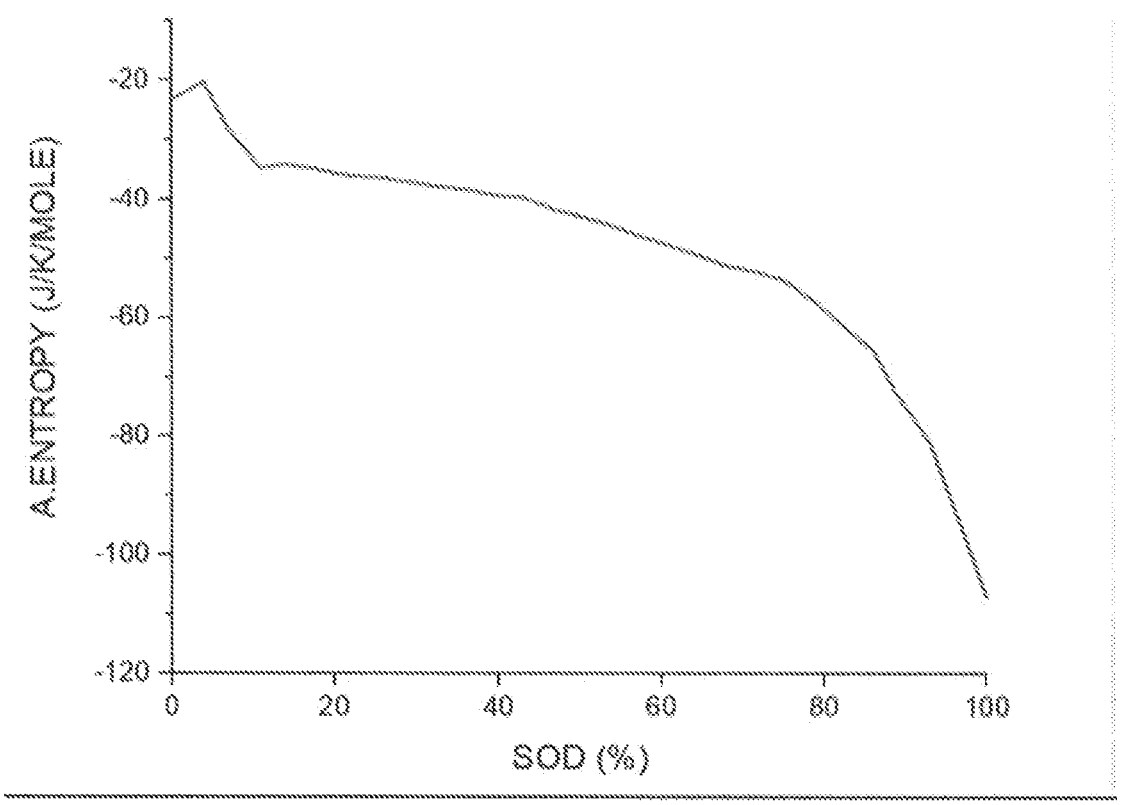
FIG. 20 illustrates an evolution of entropy vs SOD.
Figure 21:
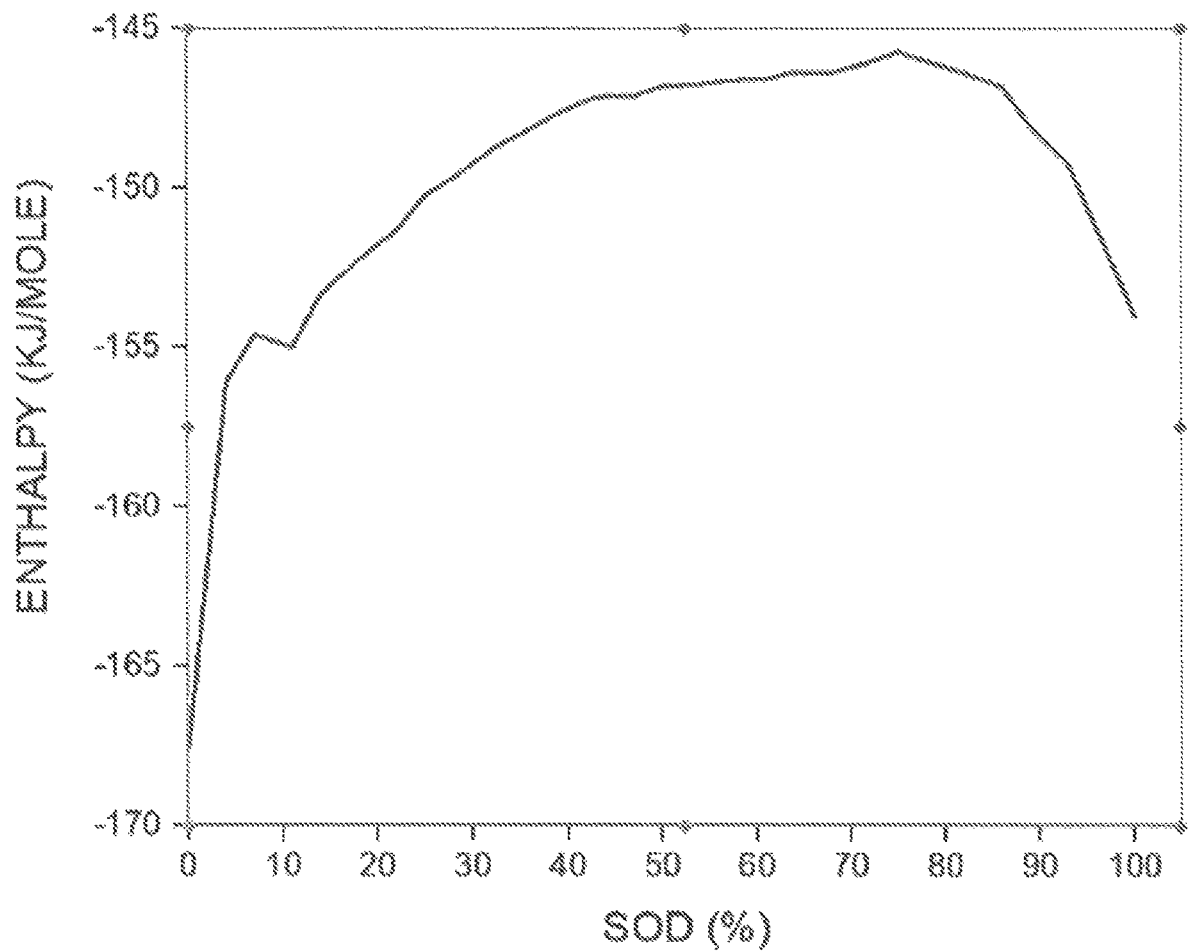
FIG. 21 illustrates an evolution of enthalpy vs SOD.
Figure 22:
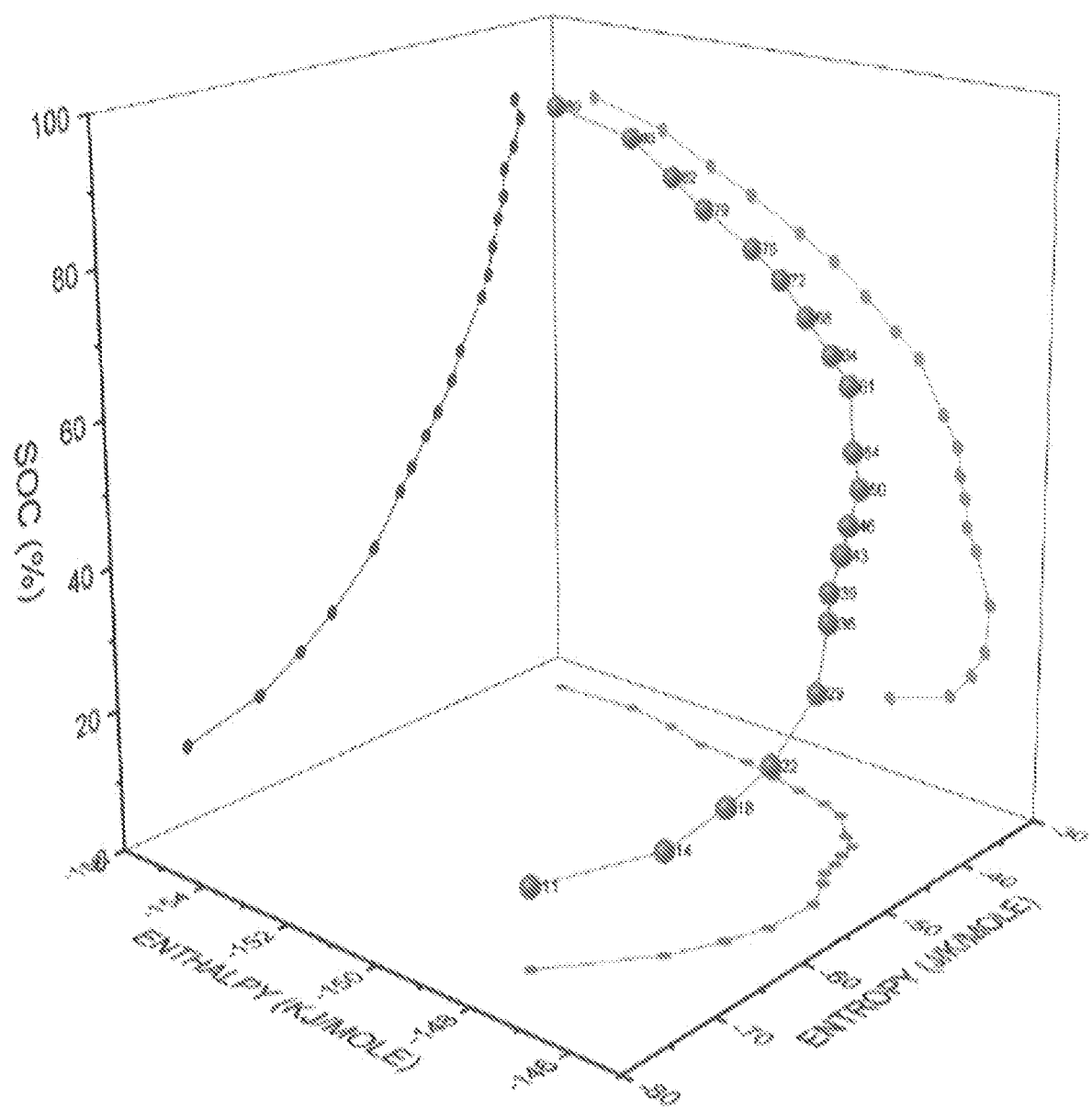
FIG. 22 is a 3D plot featuring SOC, enthalpy and entropy.
Figure 23:
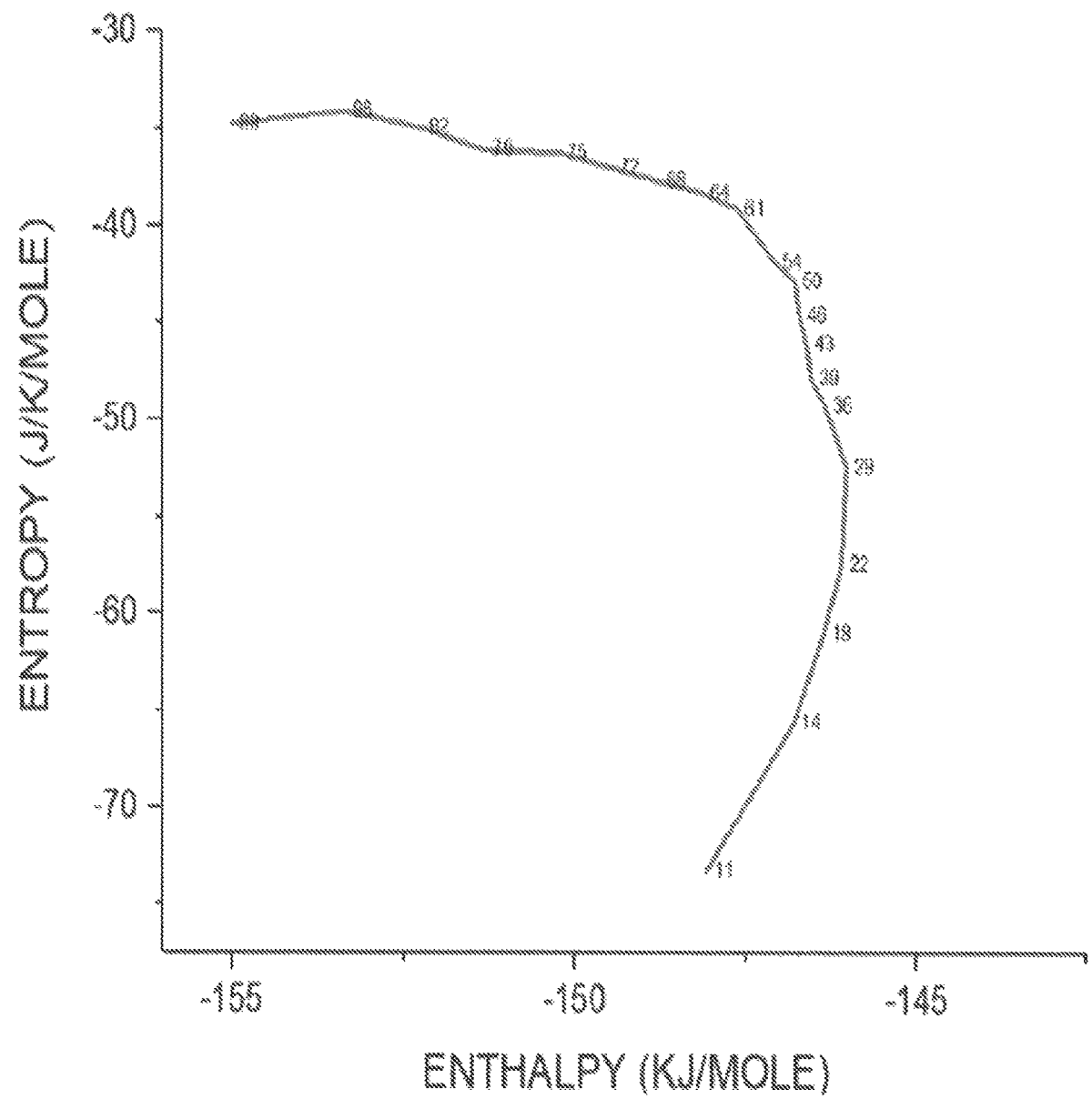
FIG. 23 illustrates a projection profile in the $\Delta S$-$\Delta H$ plan.
Figure 24:
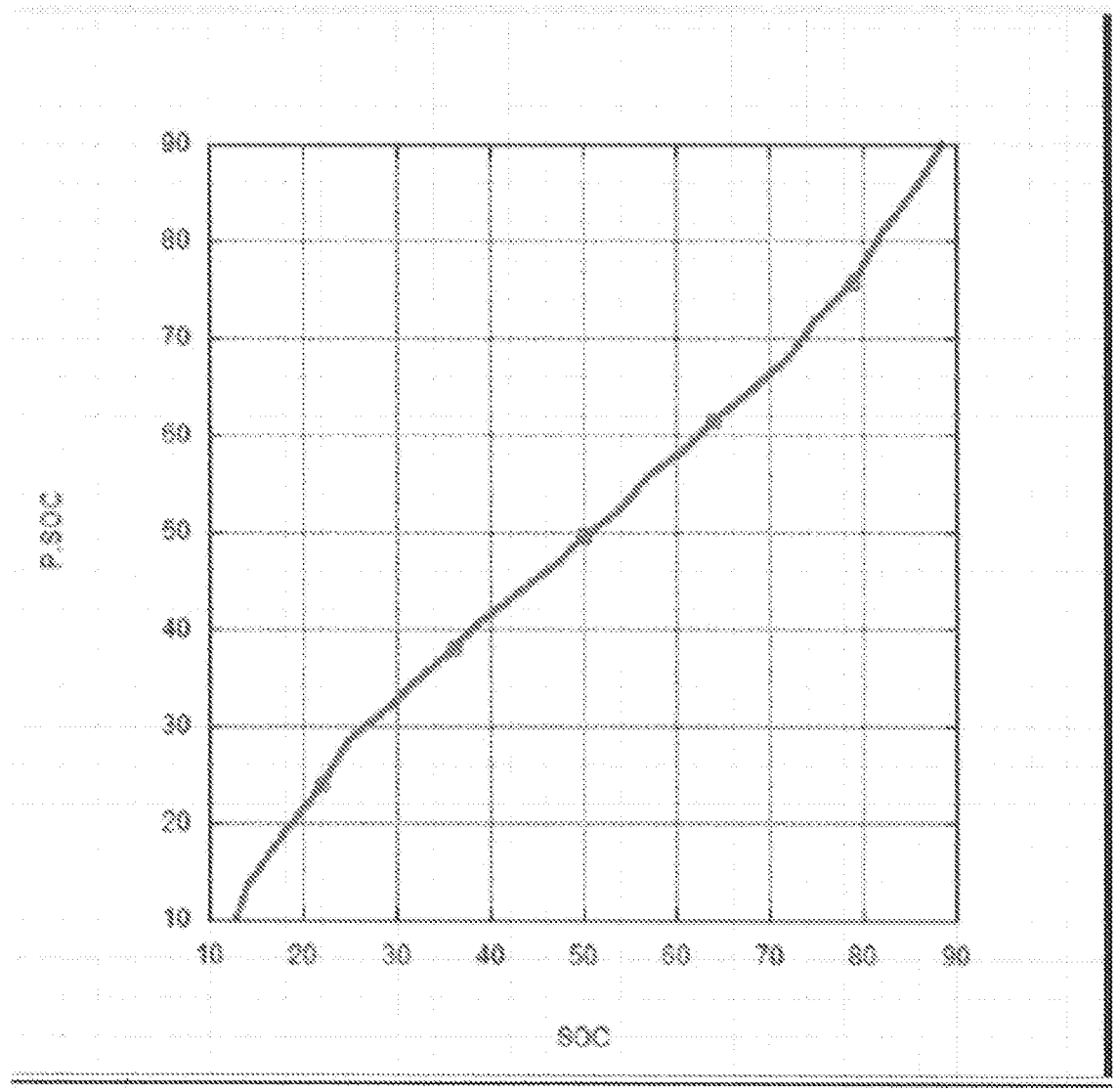
FIG. 24 illustrates a linear regression between 10 and 90% SOC for Zinc/Carbon cells, FIG. 25 features a projection file of SOC vs P.SOC for a given combination $\alpha$, $\beta$, $\gamma$, FIG. 26 features an evolution of P.SOC vs SOC.
Figure 24:
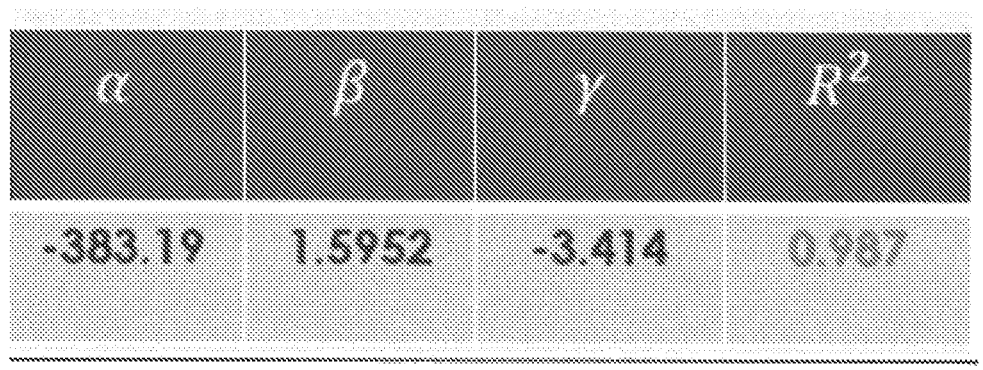
Figure 25:
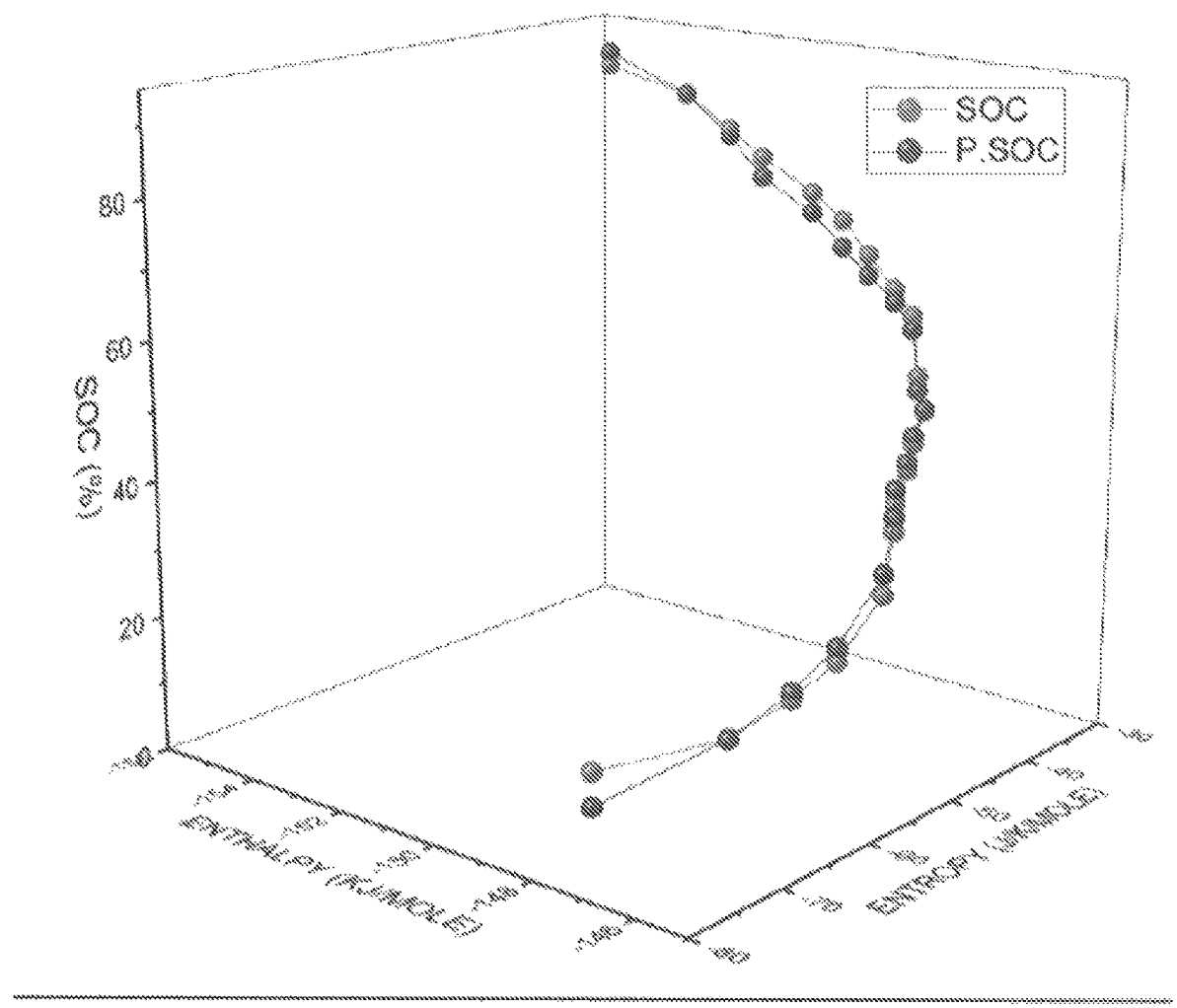
Figure 26:
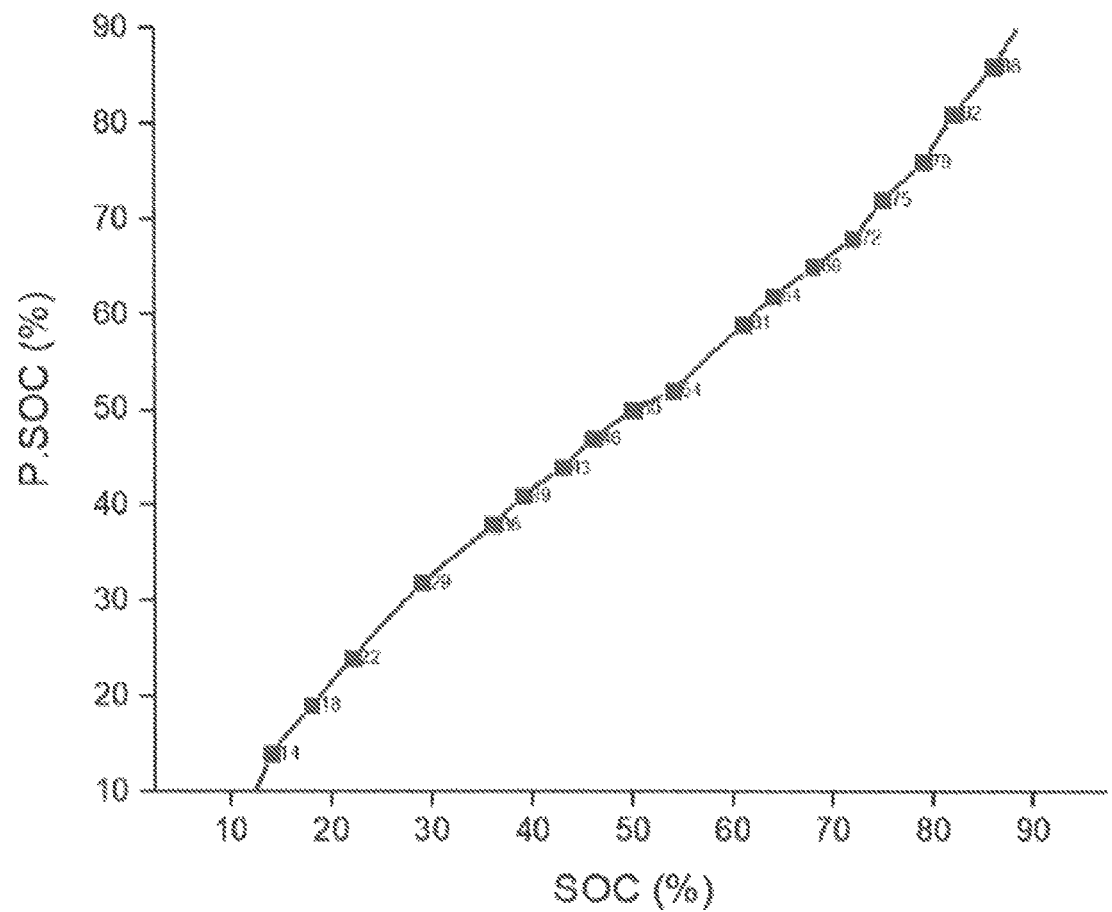
Figure 28:
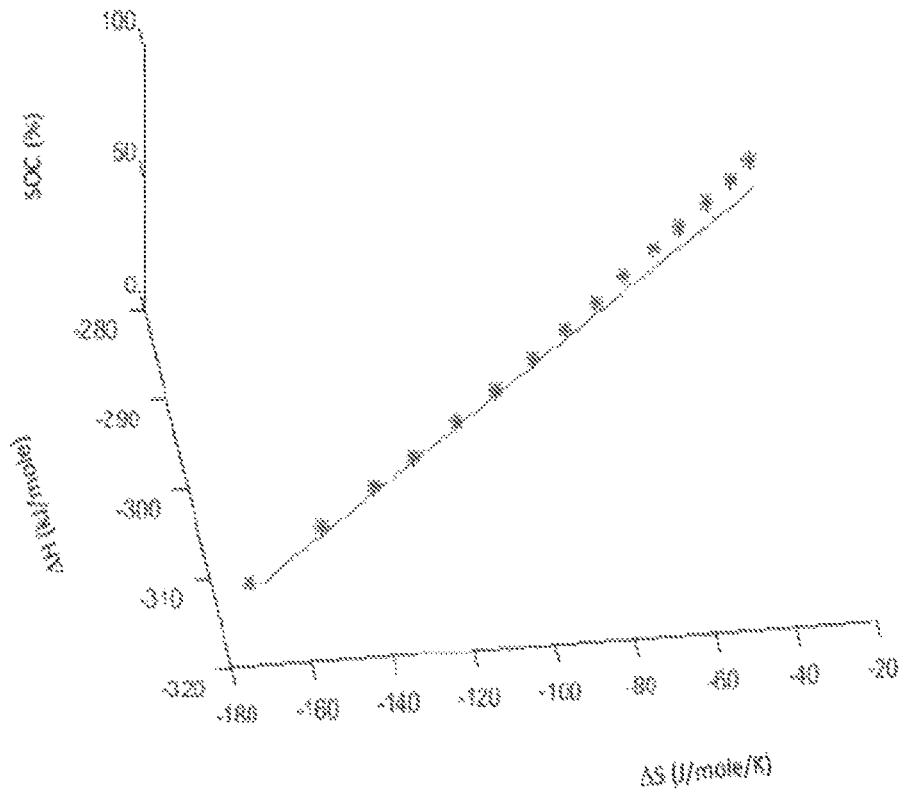
FIG. 28 illustrates SOC=f($\Delta S$, $\Delta H$) and a 3D curve for a Lithium (primary) cell 1.
Figure 29:
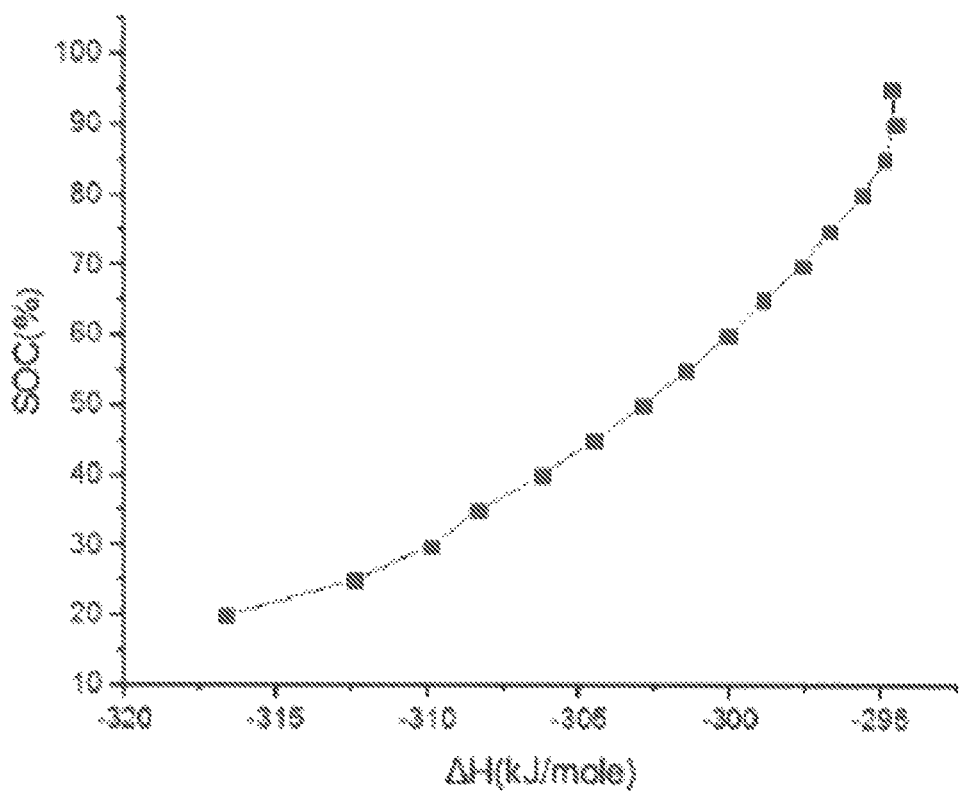
FIG. 29 illustrates a projection ($\Delta H$, SOC) and a 3D curve for a Lithium (primary) cell 2.
Figure 30A:
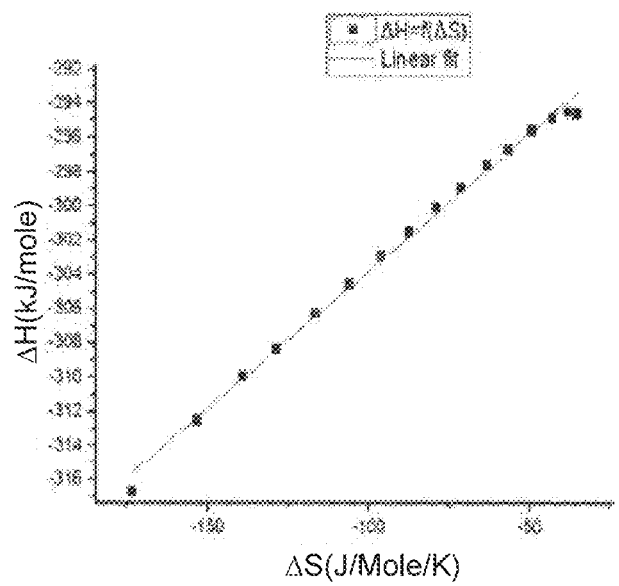
FIGS. 30A through 30C illustrate a projection ($\Delta S$, SOC) and an evolution of $\Delta H$=f($\Delta S$), FIG. 31 features four entropy profiles corresponding to several cathode compositions.
Figure 30B:
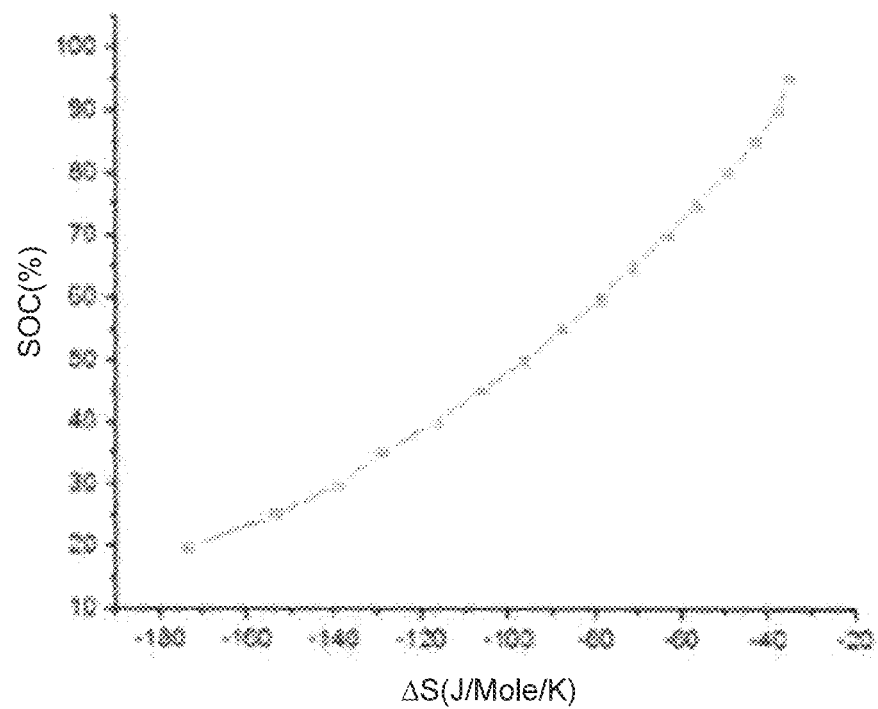
Figure 30C:
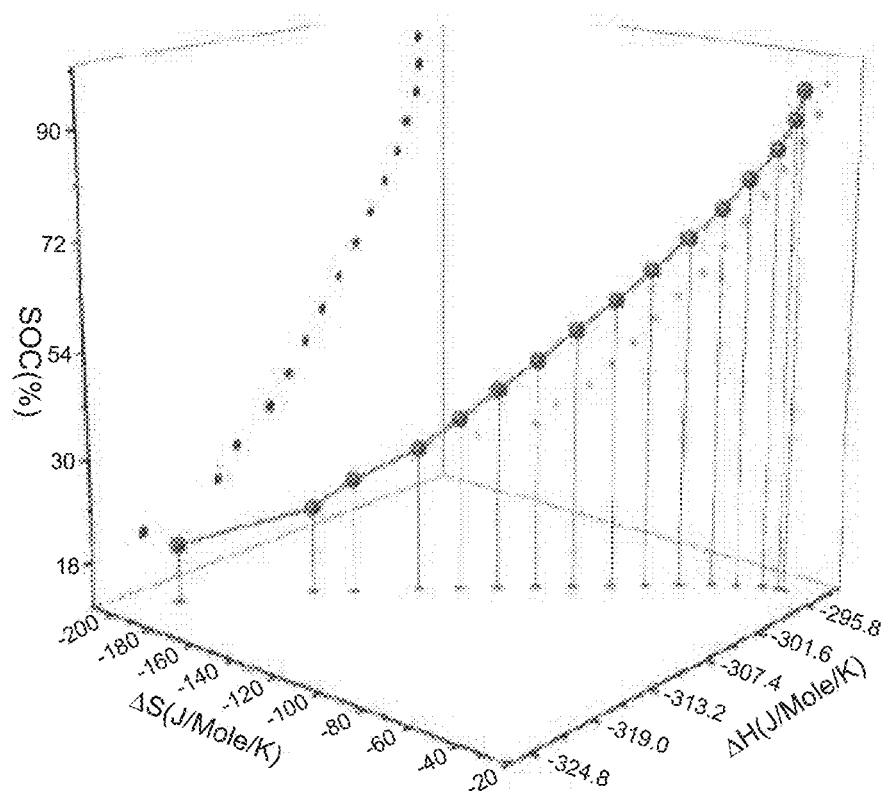

With reference to FIG. 1, a charger system 1 is provided for charging a battery (cell, pack) 2 via an electric connection 3. The charger system 1 implements an Adaptive Control Protocol (ACP) algorithm or a Cascade Pulse Charging (CPC) algorithm 4. The battery 2 is monitored by a measurement system 6 for measuring Voltage, Temperature and Current. From these measurements, Data 6 on Entropy, Enthalpy and Open-Circuit Voltage (OCV) are calculated and then processed by means of SOC, SOH Algorithms to deliver Data 7 on State of Charge (SOC) and State of Health (SOH) of the battery 2. SOC and SOH Data 7 are processed by the charger system 1.

First Experimental Test

In a first experimental test implementing Alkaline Zn/MnO$_2$ cells, with reference to FIGS. 1 to 14, discharge capacity measurements have been done using an equipment Arbin:

Discharge Current=150 mA (−C/10 rate) Voltage limits: 1.8 V to 0.8V; and

Discharge Capacity=1970 mAh.

Entropy and enthalpy measurements have been done using an equipment BA 2000.

An intermittent discharge is applied. At each step a change in SOD of 5% is applied. 20 steps are needed to go from 0% to 100% SOD (i.e., 100% SOC to 0% SOC).

A C/6 discharge rate has been applied. Voltage limits are 0.5 V to 1.9 V and the temperature range is 10° C. to 25° C. The relaxation time is 25 minutes.

Second Experimental Test

In a second experimental test implementing a zinc/carbon dry cell and illustrated by FIGS. 15-27, discharge capacity measurements have been done using an Arbin equipment. A discharge Current is equal to 160 mA with a C/10 rate and voltage limits from 1.8 V to 0.8 V. The discharge Capacity is 786 mAh.

Thermodynamic measurements have been done using a BA 2000 equipment, with a C/6 rate and a discharge current of 132 mA.

Voltage limits are 0.5 V to 1.9 V, the temperature range is 10° C. to 25° C. with a relaxation time of 25 minutes.

Experimental tests have also been done for Li/MnO$_2$ cells, with reference to FIGS. 28, 29, and 30A-30C.

Third Experimental Test

Figure 31:
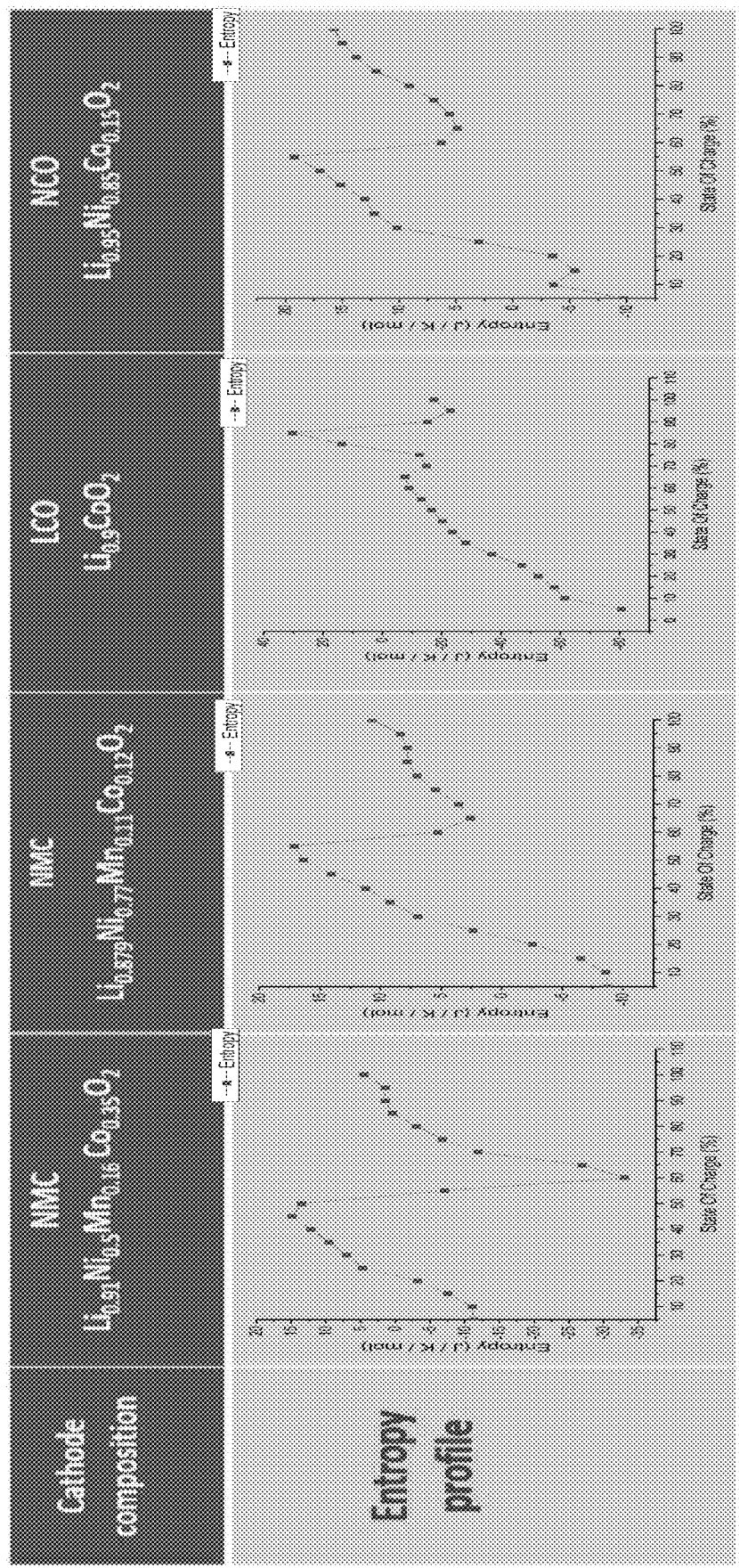
Figure 32:
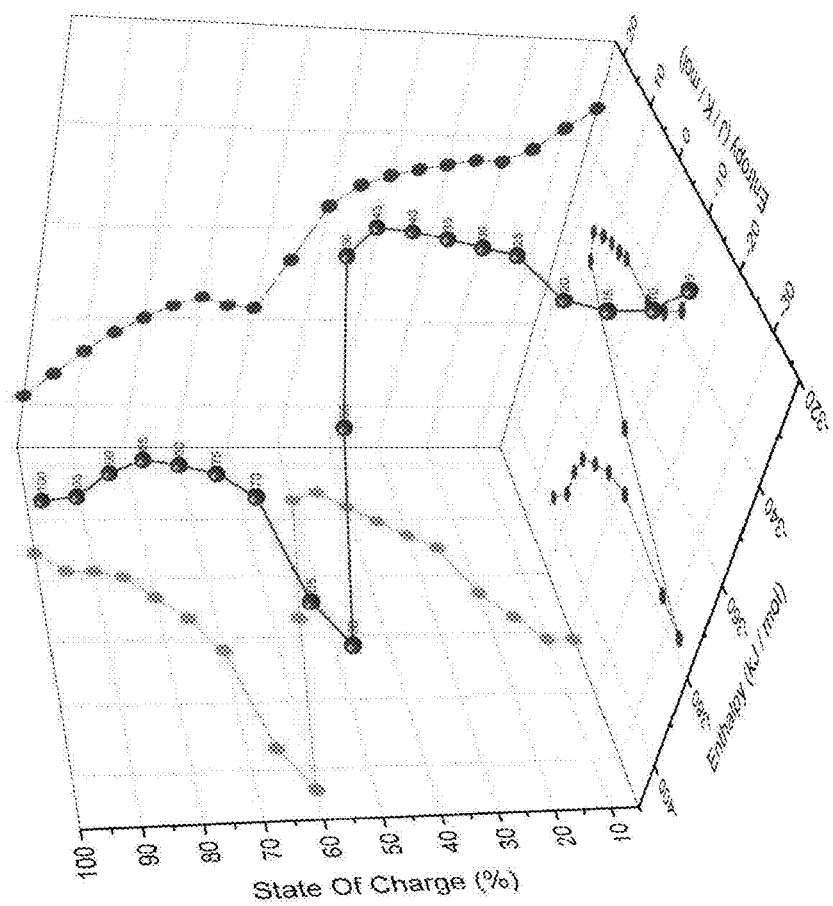
FIG. 32 represents SOC-$\Delta S$-$\Delta H$ 3D plots for a secondary Li-Ion cell, FIG. 33 features a Projection profile in the $\Delta S$-$\Delta H$ plan, FIG. 34 features several Profiles in the $\Delta S$-$\Delta H$ plan, for several cathode compositions.
Figure 33:
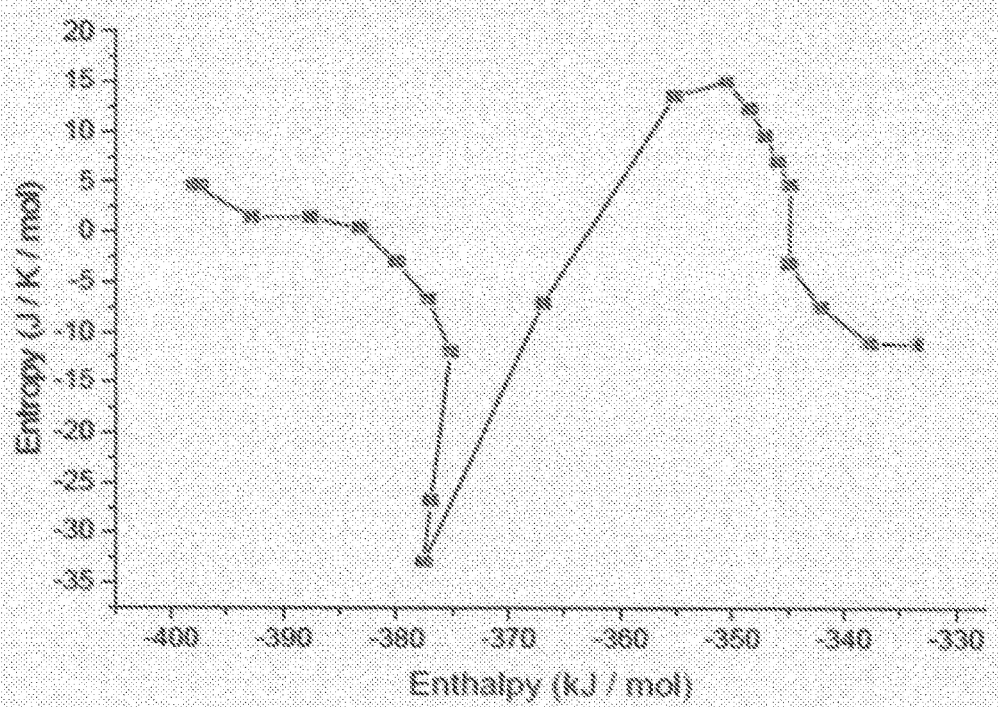
Figure 34:
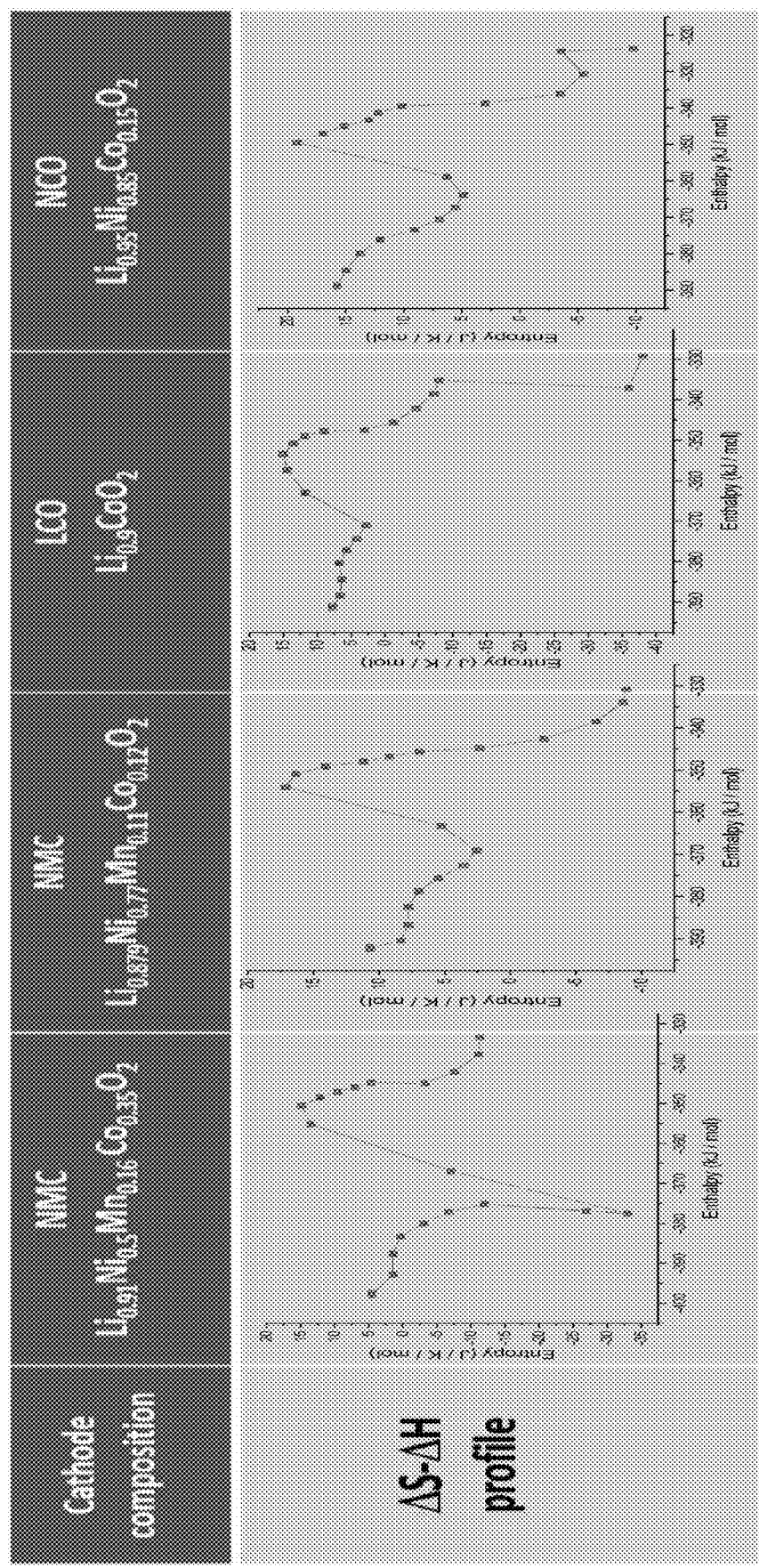
Figure 35:
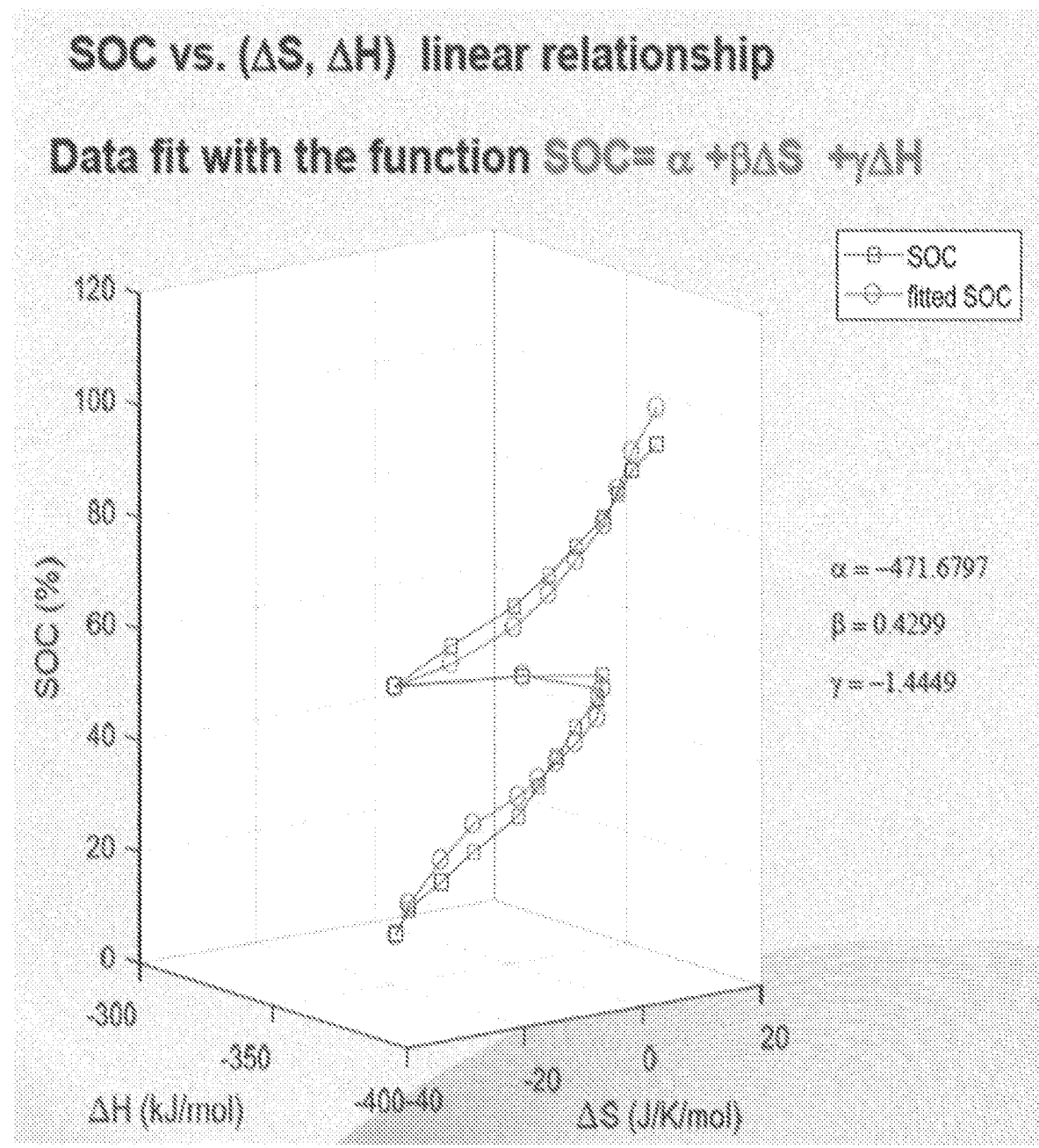
FIG. 35 illustrates a SOC vs ($\Delta S$, $\Delta H$) linear relationship, with Data fit with the function SOC=SOC=$\alpha$+$\Delta S$+$\gamma\Delta H$.
Figure 36:
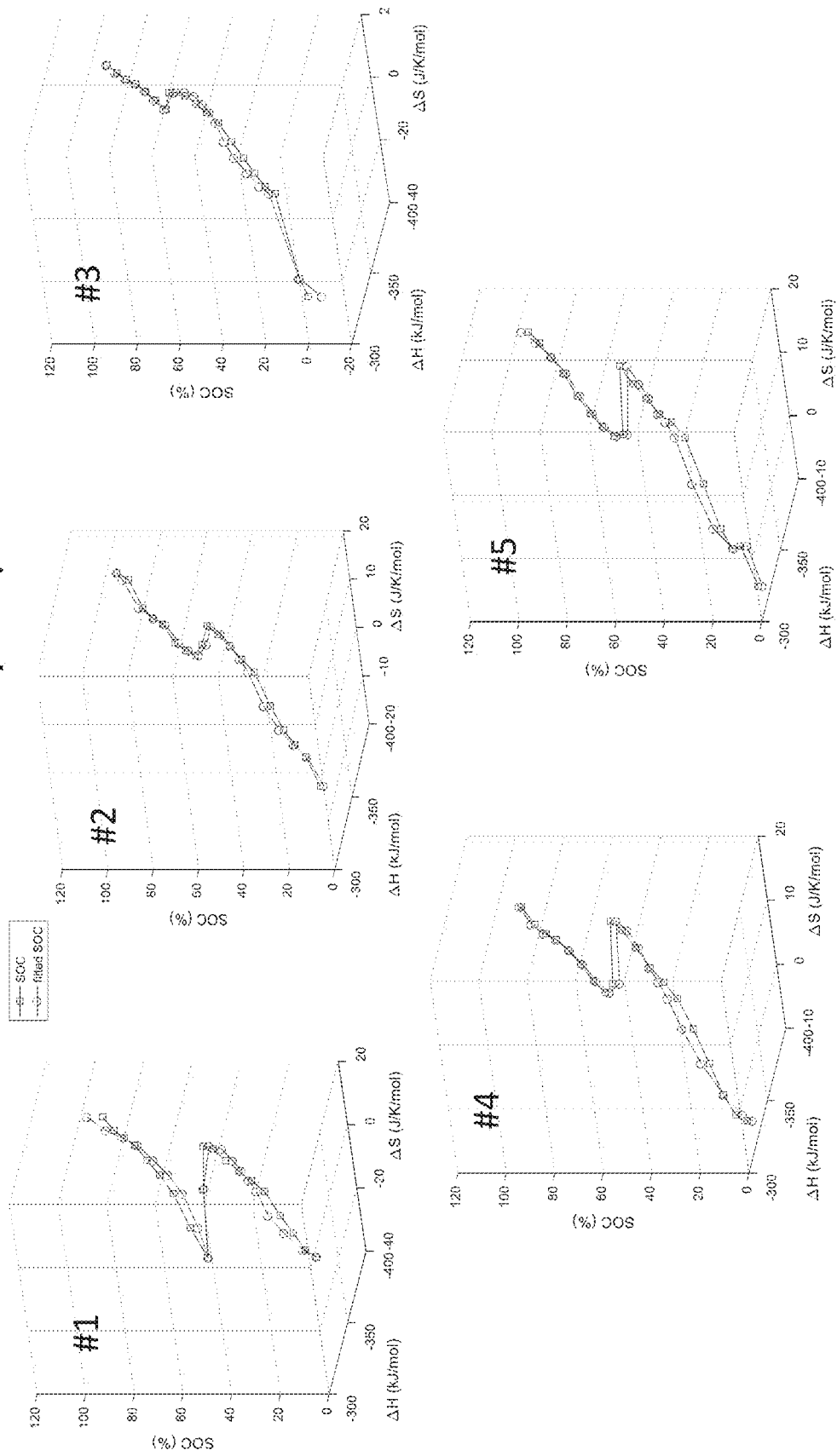
FIG. 36 illustrates SOC vs ($\Delta S$, $\Delta H$) linear relationship, applied to five LIB cell chemistries.
Figure 38:
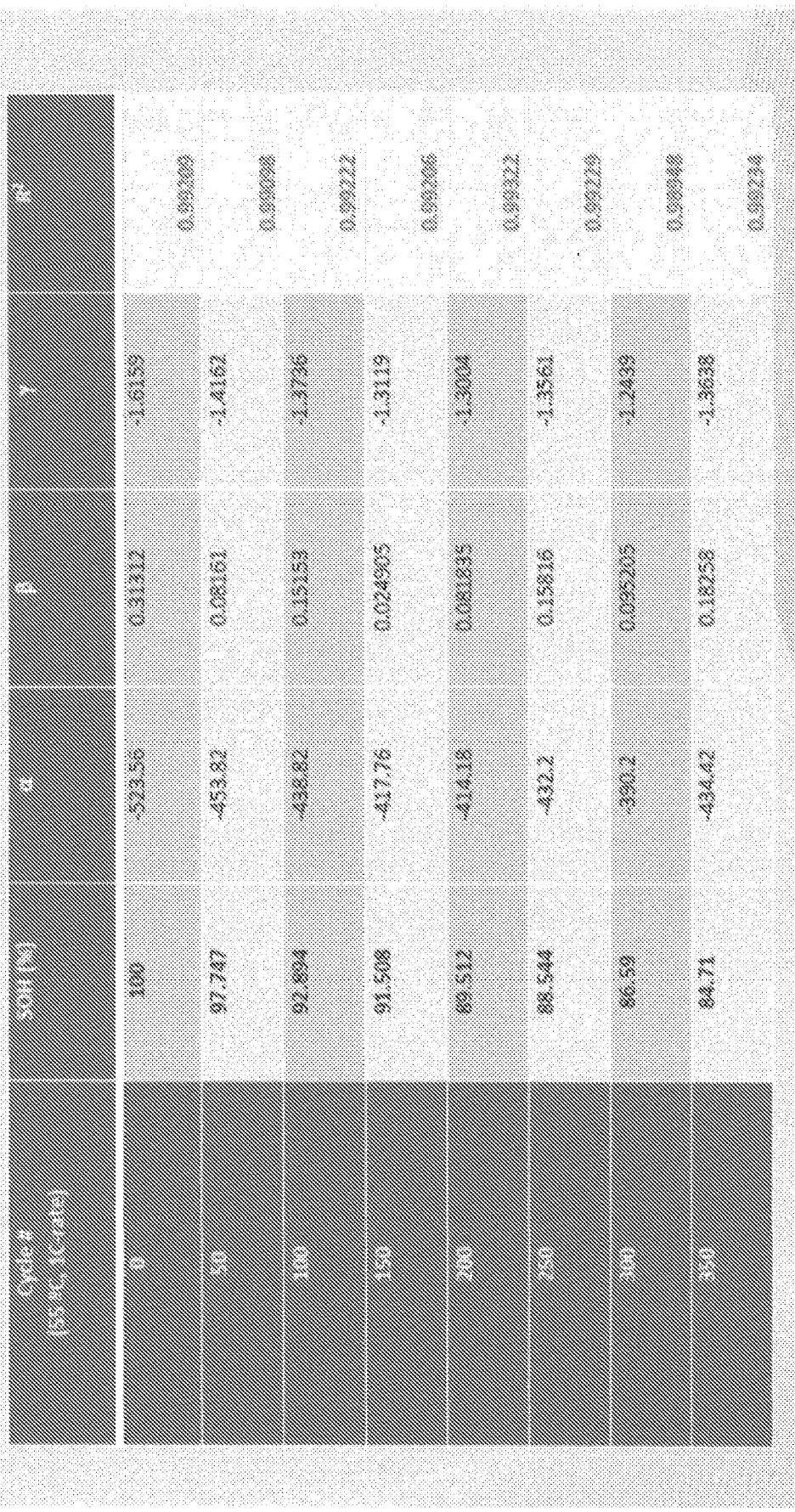
FIG. 38 is a table of SOH and parameters $\alpha$, $\beta$, $\gamma$ vs number of charging cycles.

Experimental tests have been done for Li-Ion (secondary) cells with reference to FIGS. 31-38, and several Entropy profiles have been observed depending on cathode composition, as illustrated by FIG. 31. FIG. 38 clearly shows α, β and γ parameters of Eq. 1 are SOH dependent. Accordingly, changes in the α, β and γ parameters values of Eq. 1 are used to assess the SOH of a battery cell.

Summary of Experimental Tests

As showed in FIGS. 11, 12, 14, 24, 27, 37 and 38, the α, β and γ parameters have been determined for each one of the primary and rechargeable cells together with excellent coefficient of correlation R$^2$ higher than 98% in most cases, demonstrating the universality of the Eq. 1 for assessing the cells' SOC and accordingly, the cells' SOH.

The invention claimed is:

1. A method for assessing a state of charge/discharge (SOC/SOD) for a cell comprising a secondary electrochemical cell, the cell having a first operational mode during which the cell is charged from a power supply connected to terminals of the cell, and a second operational mode during which the cell is discharged into a load and a rest mode, the method comprising the steps of:

measuring voltage, current and temperature of the cell in a course of the first and second operational modes and during the rest mode, calculating entropy variation (ΔS) data, enthalpy variation (ΔH) data, Open-Circuit voltage (OCV) data and state of charge/discharge (SOC/SOD) data, from the voltage, current and temperature measurements, determining parameters α, β and γ as a function of the calculated ΔS data, ΔH data, and SOC/SOD data that are linked by the following linear relationship:

SOC=α+βΔS+γΔH

SOD=100%−SOC, the determined α, β and γ parameters associated with a first cell aging corresponding to a first number of charging cycles of the cell, assessing next values of SOC/SOD for the cell when submitted to new charging/discharging conditions, by applying the linear relationship with the determined α, β and γ parameters, repeating the measuring, the calculating, and the determining for determining changed α, β and γ parameters as a function of recalculated ΔS data, ΔH data, and SOC/SOD data that are linked by the linear relationship, and the changed α, β and γ parameters associated with a second cell aging corresponding to a second number of charging cycles of the cell.

2. The method of claim 1, wherein the method is implemented online via an integrated circuit connected to temperature and voltage probes positioned on the cell.

3. The method of claim 1, wherein entropy (ΔS) and enthalpy (ΔH) are determined by a temperature dependence of open-circuit voltage (OCV) across the cell terminals for each state of charge (SOC) value, according to:

$$\Delta S = F \frac{\partial OCV(SOC)}{\partial T}$$
$$\Delta H = -F\left(OCV(SOC) - T\frac{\partial OCV(SOC)}{\partial T}\right).$$

4. The method of claim 1, wherein predicted SOC/SOD values are applied as inputs to a cell charger.

5. A method for assessing a state of discharge (SOD) for a cell comprising a primary electrochemical cell, the cell having an operational mode during which the cell is discharged into a load and a rest mode, the method comprising the steps of:

measuring voltage, current and temperature of the cell in a course of the operational mode and during the rest mode, calculating entropy variation (ΔS) data, enthalpy variation (ΔH) data, Open-Circuit voltage (OCV) data and state of discharge (SOD) data, from the voltage, current and temperature measurements, determining parameters α', β' and γ' as a function of the calculated ΔS data, ΔH data, and SOD data that are linked by the following linear relationship:

SOD=100%−α'−β'ΔS−γ'ΔH, the determined α', β' and γ' parameters associated with a first cell aging corresponding to first aging conditions, assessing next values of SOD for the cell when submitted to new discharging conditions, by applying the linear relationship with the determined α', β' and γ' parameters, repeating the measuring, the calculating, and the determining for determining changed α', β' and γ' parameters as a function of recalculated ΔS data, ΔH data, and SOC/SOD data that are linked by the linear relationship, and the changed α', β' and γ' parameters associated with a second cell aging corresponding to second aging conditions.

6. The method of claim 5, implemented for assessing the state of discharge (SOD) for aqueous or organic lithium cells.

7. The method of claim 5, implemented for assessing the state of discharge (SOD) for a rechargeable cell like lithium-ion, NiMH, NiCd, or NaS, sodium-ion, solid state lithium rechargeable cell, redox flow batteries.

8. The method of claim 5, applied for predicting the state of discharge (SOD) for primary non-rechargeable cells.

9. A system for assessing a state of charge/discharge (SOC/SOD) for a cell comprising a secondary or rechargeable electrochemical cell, the cell having a first operational mode during which the cell is charged from a power supply connected to terminals of the cell, a second operational mode during which the cell is discharged into a load and a rest mode, the system comprising:

means for measuring voltage, current and temperature of the cell in a course of the first and second operational modes and during the rest mode, means for calculating entropy variation ($\Delta S$) data, enthalpy variation ($\Delta H$) data-, Open-Circuit voltage (OCV) data and state of charge/discharge (SOC/SOD) data, from the voltage, current and temperature measurements, means for determining parameters $\alpha$, $\beta$ and $\gamma$ as a function of the calculated $\Delta S$ data, $\Delta H$ data, and SOC/SOD data that are linked by the following linear relationship:

SOC=$\alpha+\beta\Delta S+\gamma\Delta H$

SOD=100%−SOC, the determined $\alpha$, $\beta$ and $\gamma$ parameters associated with a first cell aging corresponding to a first number of charging cycles of the cell, means for assessing next values of SOC/SOD for the cell when submitted to new charging/discharging conditions, by applying the linear relationship with the determined $\alpha$, $\beta$ and $\gamma$ parameters, means for repeating the measuring, the calculating, and the determining for determining changed $\alpha$, $\beta$ and $\gamma$ parameters as a function of recalculated $\Delta S$ data, $\Delta H$ data, and SOC/SOD data that are linked by the linear relationship, and the changed $\alpha$, $\beta$ and $\gamma$ parameters associated with a second cell aging corresponding to a second number of charging cycles of the cell.

10. The system of claim 9, characterized in that it is connected to a system for charging electrochemical cells.

11. A system for assessing a state of discharge (SOD) for a cell comprising a primary electrochemical cell, the cell having an operational mode during which the cell is discharged into a load and a rest mode, the system comprising:

means for measuring voltage, current and temperature of the cell in a course of the operational mode and during the rest mode, means for calculating entropy variation ($\Delta S$) data, enthalpy variation ($\Delta H$) data, Open-Circuit voltage (OCV) data and state of discharge (SOD) data, from the voltage, current and temperature measurements, means for determining parameters $\alpha'$, $\beta'$ and $\gamma'$ as a function of the calculated $\Delta S$ data, $\Delta H$ data, and SOD data that are linked by the following linear relationship:

SOD=100%−($\alpha'+\beta'\Delta S+\gamma'\Delta H$), the determined $\alpha'$, $\beta'$ and $\gamma'$ parameters associated with a first cell aging corresponding to first aging condition, means for assessing next values of SOD for the cell when submitted to new discharging conditions, by applying the linear relationship with the determined $\alpha'$, $\beta'$ and $\gamma'$ parameters, and means for repeating the measuring, the calculating, and the determining for determining changed $\alpha'$, $\beta'$ and $\gamma'$ parameters as a function of recalculated $\Delta S$ data, $\Delta H$ data and SOD data that are linked by the linear relationship, the changed $\alpha'$, $\beta'$ and $\gamma'$ parameters associated with a second cell aging corresponding to second aging conditions.

12. The system of claim 11, further comprising: an integrated circuit connected to temperature and voltage probes attached to or embedded in the cell.

13. The system of claim 12, wherein the integrated circuit implements the means for calculating.

14. The system of claim 13, wherein the integrated circuit comprises a means for telecommunication.

15. The system of claim 11, wherein the integrated circuit implements the means for calculating entropy ($\Delta S$) and enthalpy ($\Delta H$) as a temperature dependence of open-circuit voltage (OCV) across cell terminals for each state of charge (SOC) value, according to:

$$\Delta S = F\frac{\partial OCV(SOC)}{\partial T}$$

$$\Delta H = -F\left(OCV(SOC) - T\frac{\partial OCV(SOC)}{\partial T}\right).$$

* * * * *

UNITED STATES PATENT AND TRADEMARK OFFICE
CERTIFICATE OF CORRECTION

| | |
|---|---|
| PATENT NO. | : 11,901,517 B2 |
| APPLICATION NO. | : 16/770560 |
| DATED | : February 13, 2024 |
| INVENTOR(S) | : Rachid Yazami |

It is certified that error appears in the above-identified patent and that said Letters Patent is hereby corrected as shown below:

In the Specification
    Column 6, Line 22, change "SOC=SOC=$\alpha+\Delta S+\gamma\Delta H$," to --SOC=SOC=$\alpha+\beta\Delta S+\gamma\Delta H$,--

In the Claims
Claim 9, Column 9, Line 16, change "($\Delta H$) data-, Open-Circuit" to --($\Delta H$) data, Open-Circuit--
Claim 9, Column 9, Line 20, change "$\alpha$, $\beta$ and $\gamma$–as a" to --$\alpha$, $\beta$ and $\gamma$ as a--

Signed and Sealed this
Seventh Day of May, 2024

Katherine Kelly Vidal
*Director of the United States Patent and Trademark Office*